(12) United States Patent
Maixner et al.

(10) Patent No.: US 7,904,859 B2
(45) Date of Patent: Mar. 8, 2011

(54) METHOD AND APPARATUS FOR DETERMINING A PHASE RELATIONSHIP BETWEEN ASYNCHRONOUS CLOCK SIGNALS

(75) Inventors: Richard C. Maixner, West Linn, OR (US); Mario Larouche, Portland, OR (US); Chun Kit Ng, Portland, OR (US); Kenneth S. McElvain, Menlo Park, CA (US)

(73) Assignee: Synopsys, Inc., Mountain View, CA (US)

( * ) Notice: Subject to any disclaimer, the term of this patent is extended or adjusted under 35 U.S.C. 154(b) by 306 days.

(21) Appl. No.: 12/117,714

(22) Filed: May 8, 2008

(65) Prior Publication Data

US 2008/0313589 A1    Dec. 18, 2008

Related U.S. Application Data

(60) Provisional application No. 60/917,015, filed on May 9, 2007, provisional application No. 60/917,024, filed on May 9, 2007, provisional application No. 60/917,027, filed on May 9, 2007, provisional application No. 60/917,033, filed on May 9, 2007.

(51) Int. Cl.
*G06F 17/50* (2006.01)
(52) U.S. Cl. ......... 716/105; 716/103; 716/104; 327/161; 703/14
(58) Field of Classification Search .......... 716/103–105; 703/14; 327/161
See application file for complete search history.

(56) References Cited

U.S. PATENT DOCUMENTS

| | | | |
|---|---|---|---|
| 4,128,201 A * | 12/1978 | Barron et al. ................. | 714/811 |
| 5,596,742 A | 1/1997 | Agarwal et al. | |
| 5,721,890 A | 2/1998 | Langendorf | |
| 5,850,537 A | 12/1998 | Selvidge et al. | |
| 5,878,221 A * | 3/1999 | Szkopek et al. ............ | 709/218 |
| 5,943,490 A * | 8/1999 | Sample ......................... | 703/28 |
| 5,990,734 A * | 11/1999 | Wright et al. ................... | 330/2 |
| 6,002,861 A * | 12/1999 | Butts et al. ...................... | 703/16 |
| 6,052,748 A * | 4/2000 | Suominen et al. ............ | 710/57 |
| 6,072,346 A * | 6/2000 | Ghahremani ................. | 327/198 |
| 6,618,839 B1 | 9/2003 | Beardslee et al. | |

(Continued)

FOREIGN PATENT DOCUMENTS

EP    1 441 296    7/2004

(Continued)

OTHER PUBLICATIONS

PCT Invitation to Pay Additional Fees, PCT/US2008/005989, Oct. 13, 2008, 6 pages.

(Continued)

*Primary Examiner* — Naum B Levin
(74) *Attorney, Agent, or Firm* — Blakely, Sokoloff, Taylor & Zafman, LLP; Judith A. Szepesi

(57) ABSTRACT

Various techniques related to clocking signals used for automated circuit design and simulations are disclosed. In some embodiments, a method includes receiving first and second asynchronous clock signals having a first phase relationship at a first time, and sampling the second clock signal at transitions of the first clock. The method further includes storing the samples; and analyzing the samples to ascertain the first phase relationship of the second clock signal with respect to the first clock signal and provide a representation of the first phase relationship. Other embodiments are described.

20 Claims, 22 Drawing Sheets

U.S. PATENT DOCUMENTS

| | | | |
|---|---|---|---|
| 6,691,301 B2 * | 2/2004 | Bowen | 717/114 |
| 6,694,464 B1 | 2/2004 | Quayle et al. | |
| 6,701,491 B1 | 3/2004 | Yang | |
| 6,727,740 B2 * | 4/2004 | Kirsch | 327/161 |
| 6,823,497 B2 * | 11/2004 | Schubert et al. | 716/4 |
| 6,904,576 B2 * | 6/2005 | Ng et al. | 716/4 |
| 7,007,254 B1 * | 2/2006 | Borkovic et al. | 716/6 |
| 7,072,818 B1 | 7/2006 | Beardslee et al. | |
| 7,213,216 B2 | 5/2007 | Ng et al. | |
| 7,398,445 B2 | 7/2008 | Ng et al. | |
| 7,617,470 B1 * | 11/2009 | Dehon et al. | 716/16 |
| 2002/0156614 A1 | 10/2002 | Goode | |
| 2004/0222857 A1 | 11/2004 | Adkisson | |
| 2005/0081113 A1 | 4/2005 | Beard et al. | |
| 2006/0022724 A1 | 2/2006 | Zerbe et al. | |
| 2006/0062341 A1 * | 3/2006 | Edmondson et al. | 375/376 |
| 2006/0190860 A1 | 8/2006 | Ng et al. | |
| 2006/0259834 A1 | 11/2006 | Ng et al. | |
| 2008/0098339 A1 * | 4/2008 | Chan | 716/6 |
| 2008/0301601 A1 * | 12/2008 | Ng et al. | 716/5 |
| 2008/0313578 A1 * | 12/2008 | Maixner et al. | 716/3 |
| 2008/0313579 A1 * | 12/2008 | Larouche et al. | 716/3 |

FOREIGN PATENT DOCUMENTS

| | | |
|---|---|---|
| KR | 10-0710972 B1 | 4/2007 |
| KR | 10-0767957 B1 | 10/2007 |
| KR | 10-0812938 B1 | 3/2008 |

OTHER PUBLICATIONS

PCT International Search Report and Written Opinion, PCT/US2008/005989, Dec. 29, 2008, 23 pages.

PCT Invitation to Pay Additional Fees, PCT/US2008/006011, Sep. 30, 2008, 6 pages.

PCT International Search Report and Written Opinion, PCT/US2008/006009, Sep. 25, 2008, 10 pages.

PCT Invitation to Pay Additional Fees, PCT/US2008/006012, Oct. 16, 2008, 6 pages.

Chuang, Chin-Lung, et al., "A Snapshot Method to Provide Full Visibility for Functional Debugging using FPGA," Proceedings of the 13th Asian Test Symposium, IEEE Computer Society, Nov. 15, 2004, 6 pages.

Chuang, Chin-Lung, et al., "Hybrid Approach to Faster Functional Verification with Full Visibility," IEEE Design & Test of Computers, Advances in Functional Validation through Hybrid Techniques, vol. 24, No. 2, Mar. 1, 2007, pp. 154-162.

Koch, Gernot, et al., "Debugging of Behavioral VHDL Specifications by Source Level Emulation," Design Automation Conference, IEEE Computer Society, Sep. 18, 1995, pp. 256-261.

PCT International Search Report and Written Opinion, PCT/US2008/006012, Jan. 14, 2009, 21 pages.

PCT International Search Report and Written Opinion, PCT/US2008/006011, mailing date Mar. 17, 2009, 21 pages.

* cited by examiner

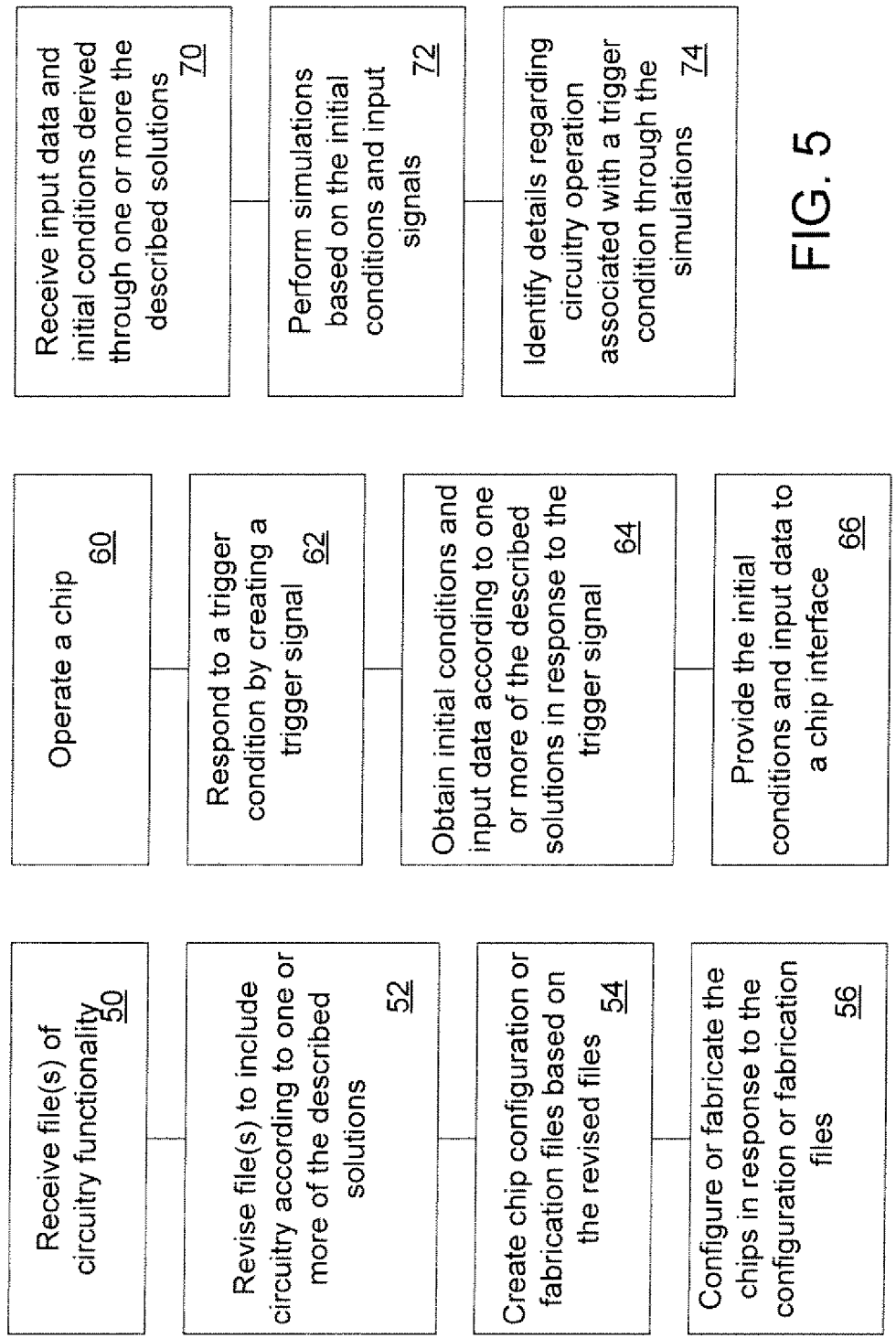

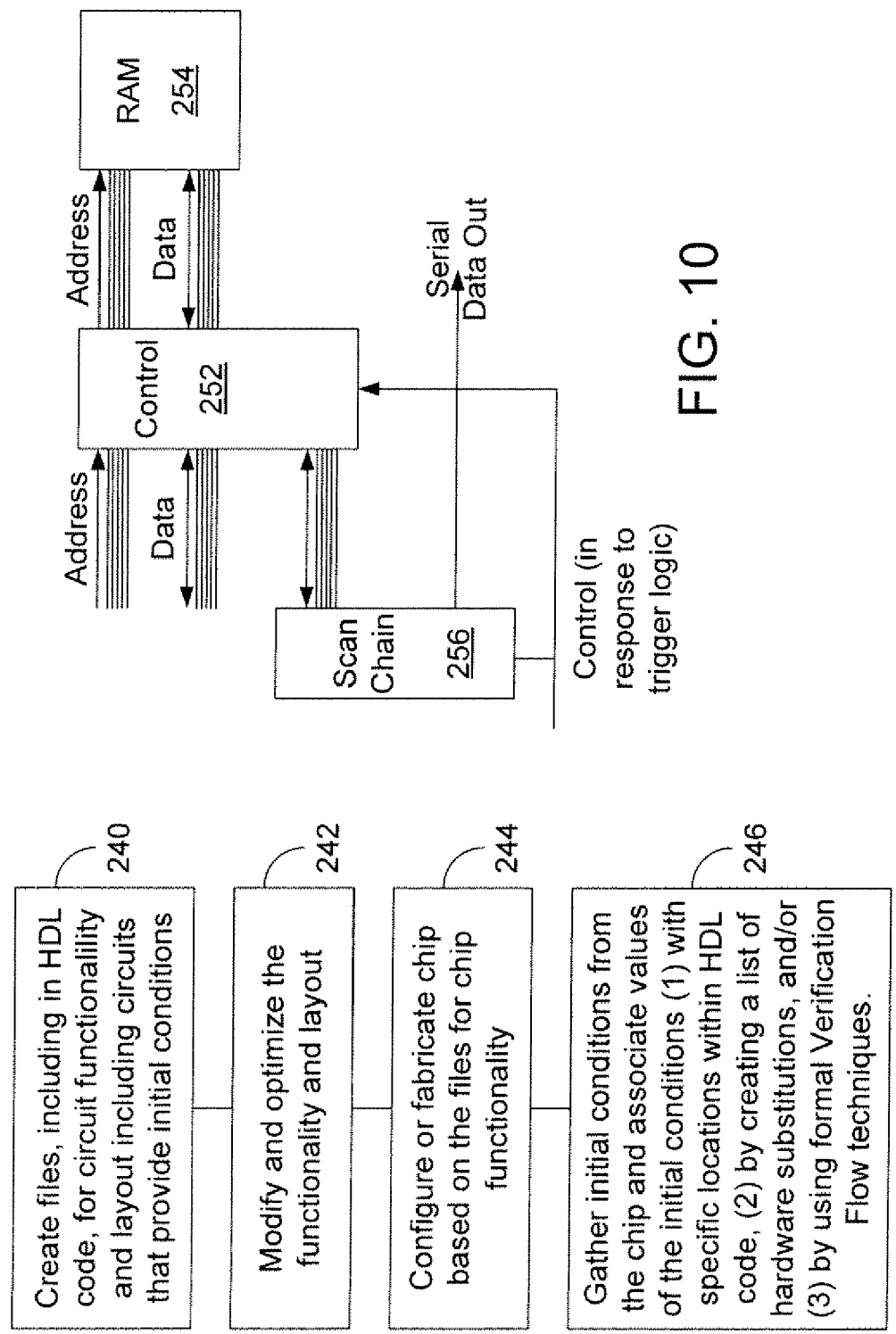

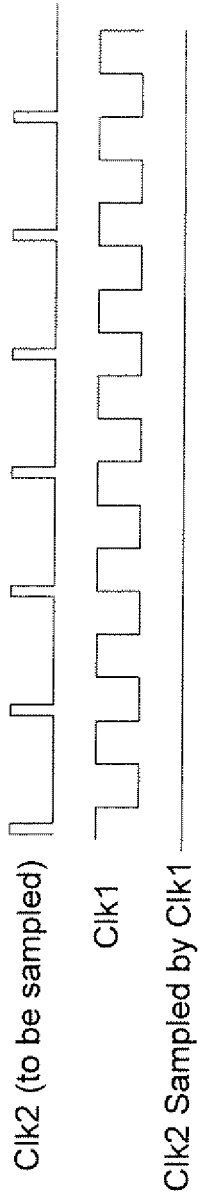
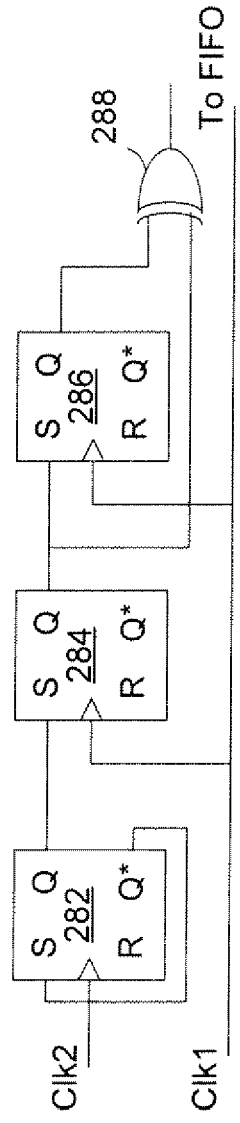
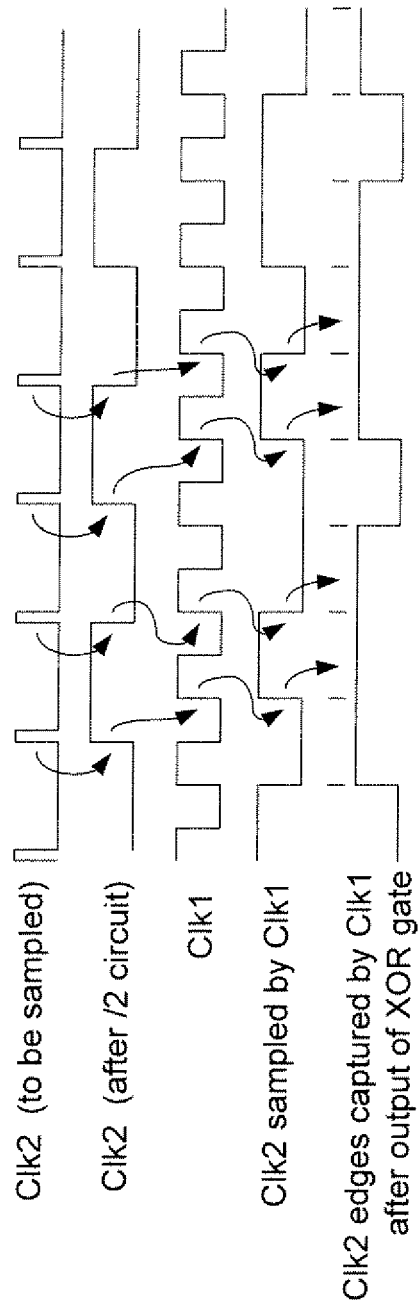
FIG. 13
FIG. 14
FIG. 15

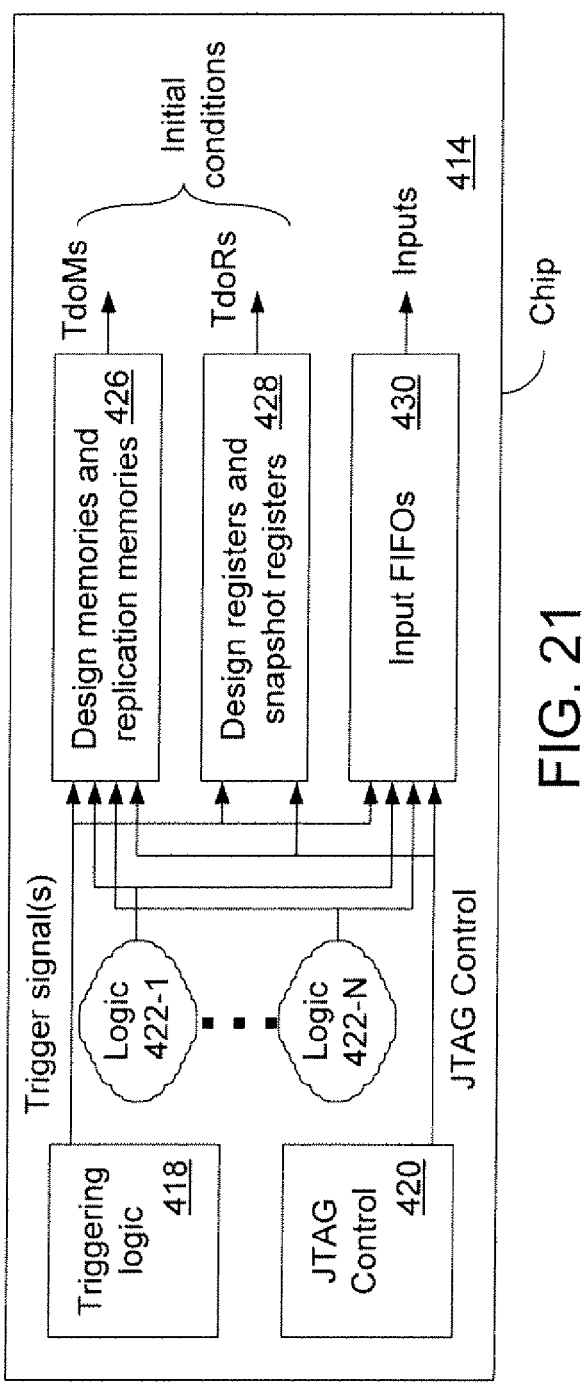
FIG. 21
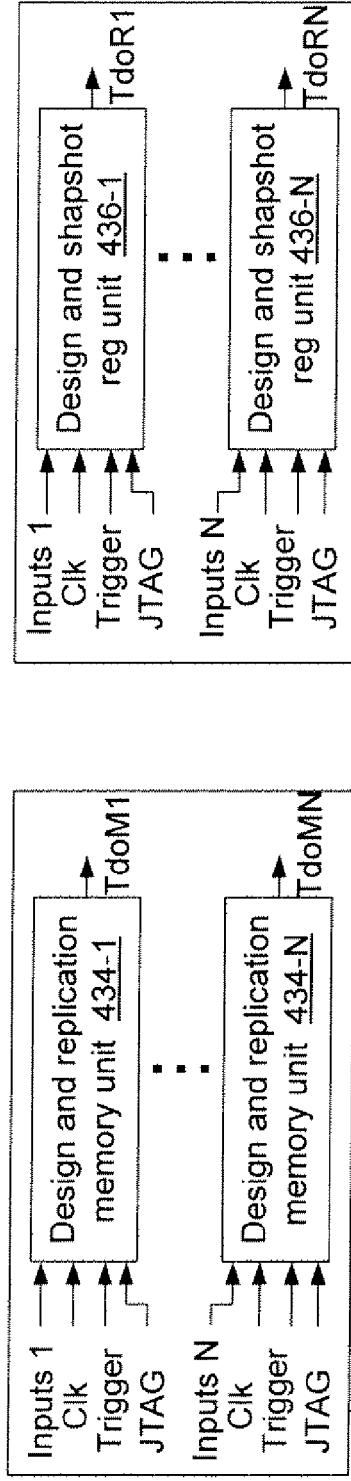
FIG. 23
FIG. 22

METHOD AND APPARATUS FOR DETERMINING A PHASE RELATIONSHIP BETWEEN ASYNCHRONOUS CLOCK SIGNALS

RELATED APPLICATIONS

This application claims benefit of U.S. Provisional Application No. 60/917,015, filed May 9, 2007, U.S. Provisional Application No. 60/917,024, filed May 9, 2007, U.S. Provisional Application No. 60/917,027, filed May 9, 2007, and U.S. Provisional Application No. 60/917,033, filed May 9, 2007; these applications are hereby incorporated herein by reference in their entirety. This application is being filed on the same day as application no. 60/917,024, filed May 8, 2008, entitled: "Snapshot Registers Used in Gathering Signals for Simulations", application no. 60/917,027, filed May 8, 2008, entitled: "Time Division Multiplexing Used in Gathering Signals for Simulations", and application no. 60/917,015, filed May 8, 2008, entitled: "Techniques for Use with Automated Circuit Design and Simulations". These four applications are the same except for this paragraph, the title, the summary section, the claims, and the abstract.

FIELD

Embodiments of the inventions relate generally to automated circuit design and/or circuit simulation.

BACKGROUND

Integrated circuits (ICs or Chips) are used in a wide variety of systems including personal computers, embedded controllers, cell phones, and other communication devices to name only a few. Circuit designers often employ computer aided techniques for circuit design and simulation. Standard languages such as Hardware Description Languages (HDLs) have been developed to describe digital circuits to aide in the design and simulation of complex digital circuits. Several hardware description languages, including but not limited to VHDL and Verilog, have evolved as industry standards. VHDL and Verilog are general purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A correlating (mapping) operation is then performed to convert from the technology independent RTL netlist to a technology specific netlist which can be used to create circuits in the vendor's technology/architecture. FPGA vendors utilize different technology/architecture to implement logic circuits within their integrated circuits. Thus, the technology independent RTL netlist is mapped to create a netlist which is specific to a particular vendor's technology/architecture.

After the HDL code is written and compiled, the design of an integrated circuit (IC or chip) or a system which includes multiple ICs is verified to be correct. Continually advancing processing technology and the corresponding explosion in design size and complexity have led to verification problems for complex circuit designs, such as but not limited to ASICs that are difficult to solve using traditional simulation tools and techniques. Examples of current simulation tools include ModelSim, VCS and NCSIM simulation tools.

As a result, some designers build prototype boards using multiple ICs such as FPGAs to verify their ASIC designs. However, there are still problems with debugging the hardware designs. When an error is detected during debug, designers may attempt to tap signals of interest from the circuit and use a logic analyzer to determine the cause of the error. JTAG (Joint Test Action Group) is a well known technique for testing and debugging sub-blocks of integrated circuits through gaining access to information about the sub-block. However, this is a difficult process and is often not effective, especially in the case of intermittent errors. Simulators can be used to debug errors. However, errors that have already occurred are often difficult to repeat and reconstruct. Further, depending on the complexity, it may take a simulation a substantial amount of time to get to the point where an error has occurred.

SUMMARY

In some embodiments, a method includes receiving first and second asynchronous clock signals having a first phase relationship at a first time, and sampling the second clock signal at transitions of the first clock. The method further includes storing the samples; and analyzing the samples to ascertain the first phase relationship of the second clock signal with respect to the first clock signal and provide a representation of the first phase relationship.

In some embodiments, a method includes receiving first and second asynchronous clock signals at a first time, wherein the first and second clocks have a first phase relationship at the first time. The method further includes generating an intermediate signal from the second clock signal, sampling the intermediate signal at transitions of the first clock signal; and processing the sampled intermediate signal. The method further includes storing the samples of the processed sampled intermediate signal, and analyzing the samples to ascertain the phase relationship of the second clock signal with respect to the first clock signal at the first time and provide a representation of the phase representation.

In some embodiments, a method includes receiving descriptions of circuitry including a design module having first logic clocked by a first clock signal having a first frequency to output a data signal to a synchronizer circuit that is clocked by a second clock signal having a second frequency to provide the data signal to second logic. The method further includes generating additional descriptions including descriptions of a replicated module including delay circuitry clocked by the second clock signal to receive and pass through the data signal output from the synchronizer circuit, and replicated second logic to receive the data signal output by the delay circuitry.

Other embodiments may be implemented in methods, apparatuses, systems, chips, software, signals, and computers running the software or processing the signals as described below.

BRIEF DESCRIPTION OF THE DRAWINGS

Embodiments of the inventions may be understood by referring to the following description and accompanying drawings that are used to illustrate embodiments of the invention. However, the inventions are not limited to the details of these drawings.

FIG. 3 is a flow diagram illustrating for various aspects of programs that generate files for configuring or fabricating a chip according to some embodiments of the inventions.

FIG. 4 is a flow diagram illustrating for various aspects of operating a chip according to some embodiments of the inventions.

FIG. 5 is a flow diagram illustrating for various aspects of using initial condition signals and input signals in a simulator according to some embodiments of the inventions.

FIG. 9 is a flow diagram illustrating for various aspects of some embodiments of the inventions.

FIG. 10 is a block diagram representation of a RAM hardware substitution according to some embodiments of the inventions.

FIGS. 12 and 13 are each a timing diagram for the system of FIG. 11.

FIG. 14 is a block diagram representation of a system for determining a phase relationship between asynchronous clock signals according to some embodiments of the inventions.

FIG. 15 is a timing diagram for the system of FIG. 14.

FIG. 21 is a block diagram representation of a chip with circuitry used in a snapshot solution according to some embodiments of the inventions.

FIG. 22 is a block diagram representation of an example of a portion of the chip of FIG. 19 according to some embodiments of the inventions.

FIG. 23 is a block diagram representation of an example of a portion of the chip of FIG. 21 according to some embodiments of the inventions.

DETAILED DESCRIPTION

Figure 1:
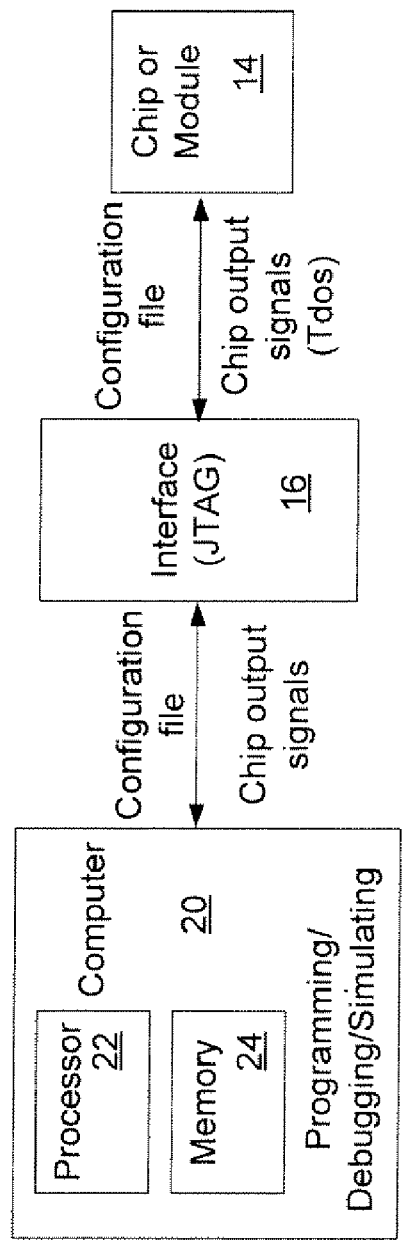
FIG. 1 is a block diagram representation of a system including a computer, an interface, and a chip according to some embodiments of the inventions.

The following description and drawings are illustrative of embodiments of the inventions and are not to be construed as limiting the inventions. Numerous specific details are described to provide an understanding of embodiments of the inventions. However, in certain instances, some well known or conventional details are not described in order to avoid obscuring the present invention.

Some embodiments of the inventions described herein involve capturing the state of a questionable logic design at a time prior to when an error or other event of interest occurs. This disclosure covers three categories of inventions: (1) logic replication solutions, (2) snapshot solutions, and (3) time division multiplexer solutions. Further, there are several inventive features (described in section III) that may be used with any of the categories of inventions. Some embodiments of the inventions involve more than one of the solutions and more than one of the additional listed features. Other embodiments include programs for designing the circuits, extracting initial condition signals and input signals from a chip, and using the initial condition signals and input signals in simulations. The term "chip" as used in the present description includes "module". The following table of contents gives an outline of the disclosure.

I. Systems overview
    II. Logic replication solutions
    III. Additional features for some embodiments
        A. Functional equivalent but different replicated module
        B. Correlating initial conditions to HDL code in simulator
        C. Generating a list of hardware substitutions
        D. Access to internal states
        E. Formal verification flow techniques
        F. Partitioning
        G. Black boxes
        H. Multi-clock domains
        I. Sampling a slower clock with a faster clock
        J. Sampling a signal generated from a slower clock with a faster clock
        K. Replication in separate FPGA or ASIC
    IV. Snapshot solutions
    V. Time division multiplexer solutions
    VI. Additional information and embodiments The disclosure uses the phases "in some embodiments" and "in other embodiments" to refer to implementations of one or more of the various inventions described herein. Different references to "some embodiments" are not necessarily referring to the same embodiments. Some methods, apparatus, systems, and chips may include more than one embodiment.

I. Systems Overview

Testing logic designs is an important step where the failure is analyzed by running simulation. A set of initial conditions and inputs that leads to the actual error can be used in a simulation to recreate the problem to enable the designer to eventually find a solution to eliminate it. In an exemplary configuration, a chip is tested until a failure occurs. The chip is also connected by an interface to allow recording the inputs and conditions leading to the failure. The information is then fed to a simulation program to analyze the cause of the problem.

Referring to FIG. 1, a chip (or a module) 14 interfaces with a computer 20 through an interface 16 (which may be a JTAG interface). In some embodiments, chip 14 includes gate arrays that are configured by a program in computer 20 through a JTAG interface 16. The configuration allows visibility to various signals of the chip through the JTAG interface. As is described in detail herein, after chip 14 is configured, it is operated to gather initial condition signals ("initial conditions") and input signals with a circuit in which an error or another event of interest occurs. Some embodiments of the inventions involve delaying input signals until a trigger condition (e.g., error condition) occurs and then freezing the delayed input signals. The contents of certain replicated or added registers (and in some implementations, other memory) hold the initial conditions, which are the contents of those registers (and other memory) at or near the beginning of the group of frozen delayed input signals. The delayed input signals are then the input signals that led up to the trigger condition. The initial condition and input signals can be provided to a simulator to simulate (among other things) the operation of a circuit of interest leading up to the trigger condition.

The initial conditions and input signals are provided through JTAG interface 16 to a simulator in computer 20. Generally, the data are not provided directly from the interface to the simulator, but through another software program. The simulator includes a software program stored in memory 24 that runs in a processor 22. With the benefit of the initial conditions and input signals, the simulator can simulate the chip in detail and attempt to discover the nature of errors or other events of interest. Accordingly, the simulator can be used for debugging and for other purposes. The computer that does the programming and configuration is not necessarily the computer that does the simulation. Other embodiments do not involve gate arrays and use interfaces other than JTAG.

To analyze a failure, early data propagation is often needed, since once a failure occurs, the data has changed significantly to mask the cause of the failure. Further, data processing is difficult to run backward, thus data backtracking cannot be performed to retrieve the earlier data. In an exemplary configuration, a new chip module is fabricated having delay inputs, and thus providing the early symptoms of errors to allow the simulation to step through.

Figure 2:
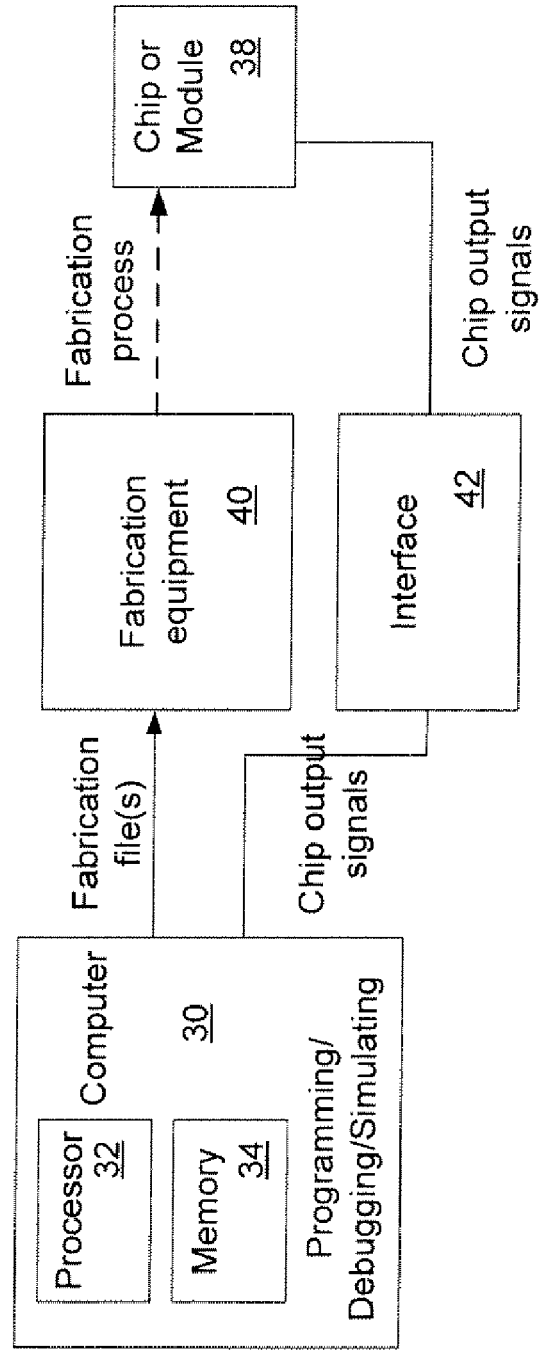
FIG. 2 is a block diagram representation of a system including a computer, fabrication equipment, an interface, and a chip according to some embodiments of the inventions.

FIG. 2 illustrates a system in which a computer 30 includes a program or programs to provide a chip fabrication file or files to fabrication equipment 40 to fabricate a chip (or module) 38. The components of FIG. 1 could include more than one computer and various pieces of fabrication equipment in different locations and operated at different times. After chip 38 is fabricated, it is operated to gather initial conditions and input signals that are associated with a circuit in which an error or another event of interest occurs. The initial conditions and input signals are provided through an interface 42 to a simulator in computer 30. The simulator includes a software program stored in memory 34 that runs in a processor 32. With the benefit of the initial conditions and input signals, the simulator can simulate the chip in detail and attempt to discover the nature of errors or other events of interest. The computer(s) that provides the fabrication file(s) is not necessarily the computer that does the simulation.

The following is an overview of the process that is associated with some embodiments. However, in other embodiments, the details may be different than are listed. A designer can select one or more modules in the source code to analyze. Certain signals can be selected for use as a trigger for debug hardware. The states of these signals can be specified by the designer to define the exact conditions for triggering the debug hardware. The debug hardware is synthesized, netlists are generated, and the final design goes through place and route. Various software tools may be used for these processes. For example, synthesis tools may be used for hardware synthesis. The designs are then placed into hardware devices such as FPGAs or ASICs. The hardware is run. Once a trigger condition has been detected, all debug hardware along with first-in first-out circuits (FIFOs) used for delays in the debug hardware are frozen. The states of FIFOs and debug hardware are acquired by the controlling computer. This information is transformed into a form that can be used by software simulators. The design is imported into the simulator, and the initial condition signals and input signals are applied. The designer or another person(s) can use the simulator to debug the hardware module. In different implementations, there are different levels of involvement of people versus automation by the programs.

The circuits discussed herein may be used in a variety of types of chips including microprocessors, embedded controllers, chipsets, cell phone chips to name only a few.

FIG. 3 is a flow diagram for generating a file(s) to configure or fabricate a chip. A program(s) in computer 20 or 30 generates a file(s) of circuitry functionality and layout or other descriptions of the circuitry (block 50). In some cases, the descriptions may include less than a complete description of functionality and layout of the circuit. The file(s) is revised or a new file(s) is generated to include circuitry accordingly to one or more of the solutions described in sections I.-VI. of this disclosure (block 52). For example, a program(s) analyzes descriptions of the circuitry (called design circuitry or original circuitry) and uses at least some information obtained in the analysis to generate additional descriptions for the revised or new files of the circuitry. Also, various other information, in addition to the descriptions of the design circuitry, can be used to generate the new circuitry. The amount of analysis of the descriptions depends on various factors including how much information is separately provided to the analyzing program(s) and how much information the program(s) must gather for itself. The amount of analysis may also vary depending on a particular command given to the program. Some commands involve more analysis than others. The range of analysis may vary from extensive to relatively little depending on the implementation and other circumstances.

The revised file(s) may be made by the same program(s) as in block 50 or by a different program(s). For example, revised files may specify replicated circuit components. Chip configuration or fabrication files are generated based on the revised files (block 54). The chip is then configured or fabricated in response to the configuration or fabrication files (block 56).

There are various techniques for representing the circuits described herein. The following is a simplified overview. For example, a text representation (for example, in HDL) of a circuit may be compiled to generate a first register transfer level (RTL) netlist. The RTL netlist may show registers and other logic interconnected to show the flow of data through a circuit that was described in the text representation. An example of a compiler is a logic synthesis compiler, which is typically a computer program that operates on a general purpose computer system, although in some embodiments, the computer system may be a dedicated, special purpose computer system. An example of a logic synthesis compiler is the program "Synplify®" from Synopsys, Inc. of Mountain View, Calif.

The first RTL netlist may be correlated (mapped) to a target architecture, such as an FPGA, to generate a prototype board for debugging the circuit. The target architecture is typically determined by a supplier of the integrated circuit. Examples of target architectures include FPGAs and complex programmable logic devices from vendors such as Altera, Xilinx, Lucent Technologies, Advanced Micro Devices (AMD), and Lattice Semiconductor. The correlating (mapping) operation may convert the RTL level description of the desired circuit into the equivalent circuit implemented using building blocks of the target architecture. A technology specific netlist may be generated. Place and route software tools may then be used to generate a design of circuitry in the target architecture.

The debug process may identify a problem area in the circuit. The designer may use a solution described herein such as selecting a portion of the circuit to replicate for further analysis. In this example, the selected portion of the circuit is replicated and associated circuitry is added. The text representation of the circuit may be recompiled to generate a revised (for example, second) RTL netlist. The revised RTL netlist may be correlated (mapped) to a target architecture, such as a FPGA or ASIC or other chips such as microprocessors, communication chips etc. The inventions are not limited to these details. Various other procedures may be used. For example, the incorporation of the replicated circuit does not have to go all the way back to the source code descriptions. The implementation of the replicated circuit can be done in the RTL netlist, or possibly incrementally modifying or adding the design RTL netlist.

FIG. 4 is a flow diagram for operating a chip to obtain initial conditions and input signals as described in this disclosure. A chip is operated (block 60). A trigger signal is generated in response to a trigger condition (block 62). The initial conditions and input signals are obtained according to one or more of the solutions described in sections I.-VI. of this disclosure (block 64). The initial conditions and input signals are provided to a chip interface (block 66).

FIG. 5 is a flow diagram for using initial conditions and input signals to perform simulations. The initial conditions and input signals that have been obtained according to one or more of the solutions described in sections I.-VI. of this disclosure are received for use by a simulator (block 70). Simulations are performed based on the initial conditions and input signals (block 72). Details regarding the circuit operation associated with the trigger condition are identified through the simulations (block 74). The simulator may use various tests or procedures.

The flow charts of FIGS. 3-5 are merely overviews for some embodiments. Other embodiments do not follow the flow charts or involve different details of them. Various additional programs and structures may be used in actual implementations.

As used herein, the terms "design circuitry," "design memory," and "design register" refer to circuitry, a memory, and a register that are part of the original design (or descriptions of the design) prior to the analysis and addition of circuitry (or descriptions of the additional circuitry) in one of the techniques described in this disclosure. The design circuitry might be called the original circuitry or circuitry at a starting point. However, the design circuitry may involve well known features. As explained below, examples of the addition of circuitry (or descriptions of the circuitry) include logic replication and related circuitry, snap shot registers and related circuitry, and multiplexers and demultiplexers and related circuitry.

II. Logic Replication Solutions

Figure 8:
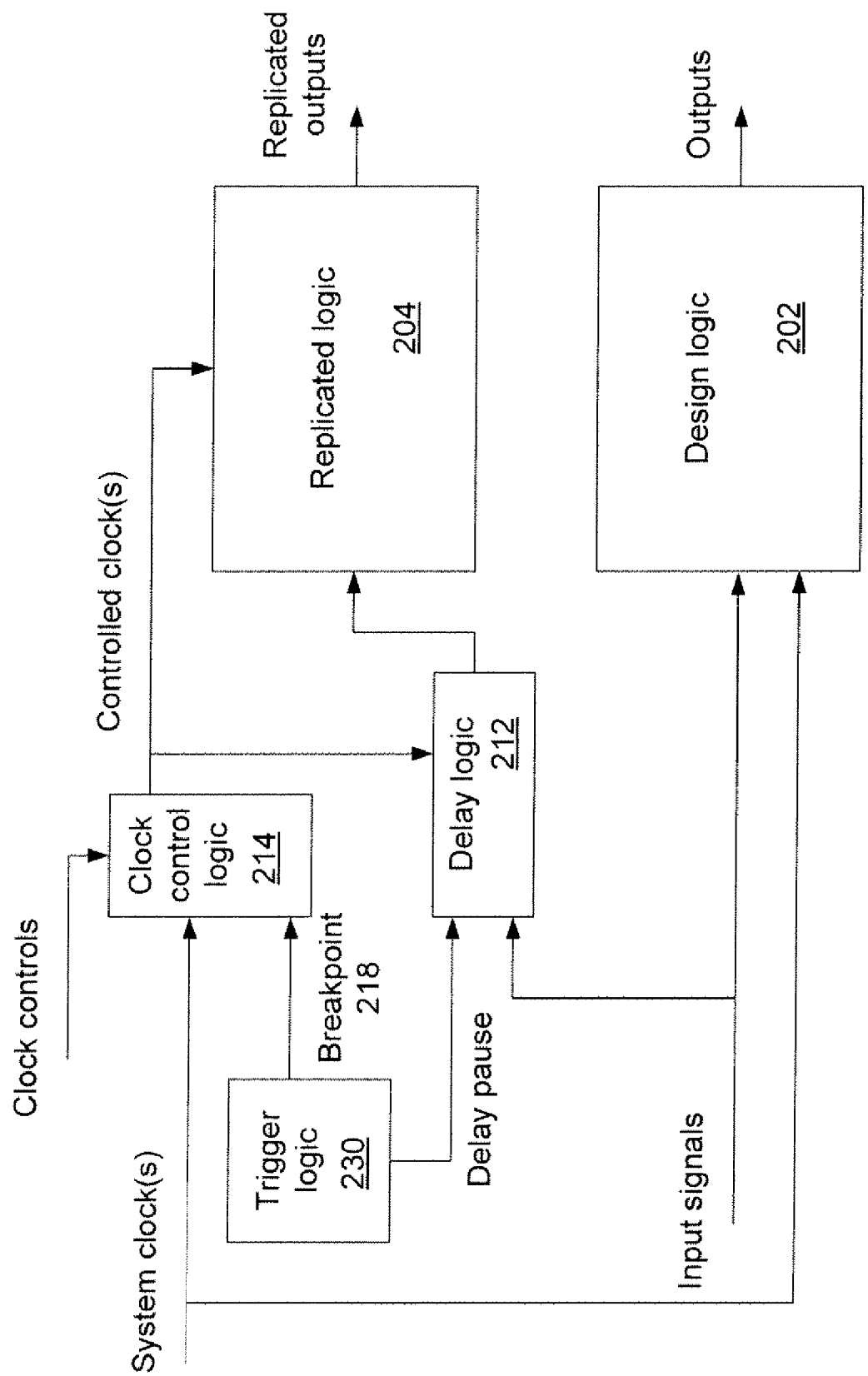
FIG. 8 is block diagram representation of logic and replicated logic with associated circuitry according to some embodiments of the inventions.

Logic replication solutions for obtaining initial condition signals and input signals involve replicating logic to offer the information that the design logic does not provide. FIG. 8, which is similar to FIG. 3 of U.S. Pat. No. 6,904,576, illustrates a system with replicated logic. FIG. 8 provides an example of circuitry in a chip including a design logic block 202 and a replicated logic block 204. As an example, suppose debug of the original design revealed a problem with logic block 202. Therefore, logic block 202 was selected and replicated as replicated logic block 204 to enable further analysis of the problem. The program(s) of FIG. 3 (block 52) is used, for example, to generate replicate logic 204. Delay logic 212 (such as a FIFO) delays the input signals provided to replicated logic block 204. Delay logic 212 may include typical circuit logic and elements, such as FIFO, that cause the input signals to arrive at replicated logic block 204 later in time than the inputs will arrive at design logic block 202. In this way, an error can be analyzed after the error is seen to occur in design logic block 202, since the error will appear in replicated logic block 204 at a later time.

Trigger logic 230 is inserted into the circuit to enable the setup of a trigger condition that pauses the replicated portion of the circuit. One or more controllers may also be inserted to control the trigger logic. In this example, trigger logic 230 has two outputs: a breakpoint signal 218 which when asserted enables clock control logic 214 to stop advancing, and a delay pause signal which when asserted enables delay logic 212 to stop advancing. The delay pause signal also causes the replicated logic 204 to freeze its register and memory contents.

Clock control logic 214 controls the clock signal(s) provided to replicated logic block 204. Clock control logic 214 may contain typical logic and circuit elements that allow a clock signal provided to replicated logic block 204 to be paused to stop the replicated logic from executing when certain conditions are present. Clock control logic 214 may also allow for single stepping through the replicated logic on a clock by clock basis to analyze an error. The breakpoint 218 may be set to pause the clock when certain conditions are present, such as when the trigger condition occurs. In some embodiments, during normal operation, the system clock that clocks the circuit flows through a latch in clock control logic 214 and acts as the clock to replicated logic block 204. The breakpoint signal may switch the clock to a latched version of the system clock, which can be controlled by the clock control signals to allow the clock signal to be paused and single-stepped on a cycle by cycle basis. Initial condition signals can be obtained from registers and memories in replicated logic 204 and input signals can be obtained from delay logic 212. The inventions are not required to include the details shown and described, but may be implemented in other ways.

In some embodiments, the present invention discloses various innovative ways to implement a logic replication solution. In an embodiment, additional serial circuitry can be provided to serially receive data from the replicated module. For example, FIG. 6 includes a chip 100 that includes design circuitry 104 and a replication module 106. Design circuitry 104 includes design logic under test 110 and additional logic 112. Design logic under test 110 could be referred to as a design module. Design logic under test 110 and additional logic 112 are circuitry intended to be used in a production version of the chip of interest. Of course, the design circuitry may be changed before a production version of the design is completed. In the example, design logic under test 110 includes registers 116 and 118 and could include a variety of other components such as additional registers, memory, various circuitry, and in some embodiments, firmware. Replication module 106 includes replicated logic under test 130 which includes circuitry like that in design logic under test 110 including registers 138 and 140 which are like registers 116 and 118.

Figure 6:
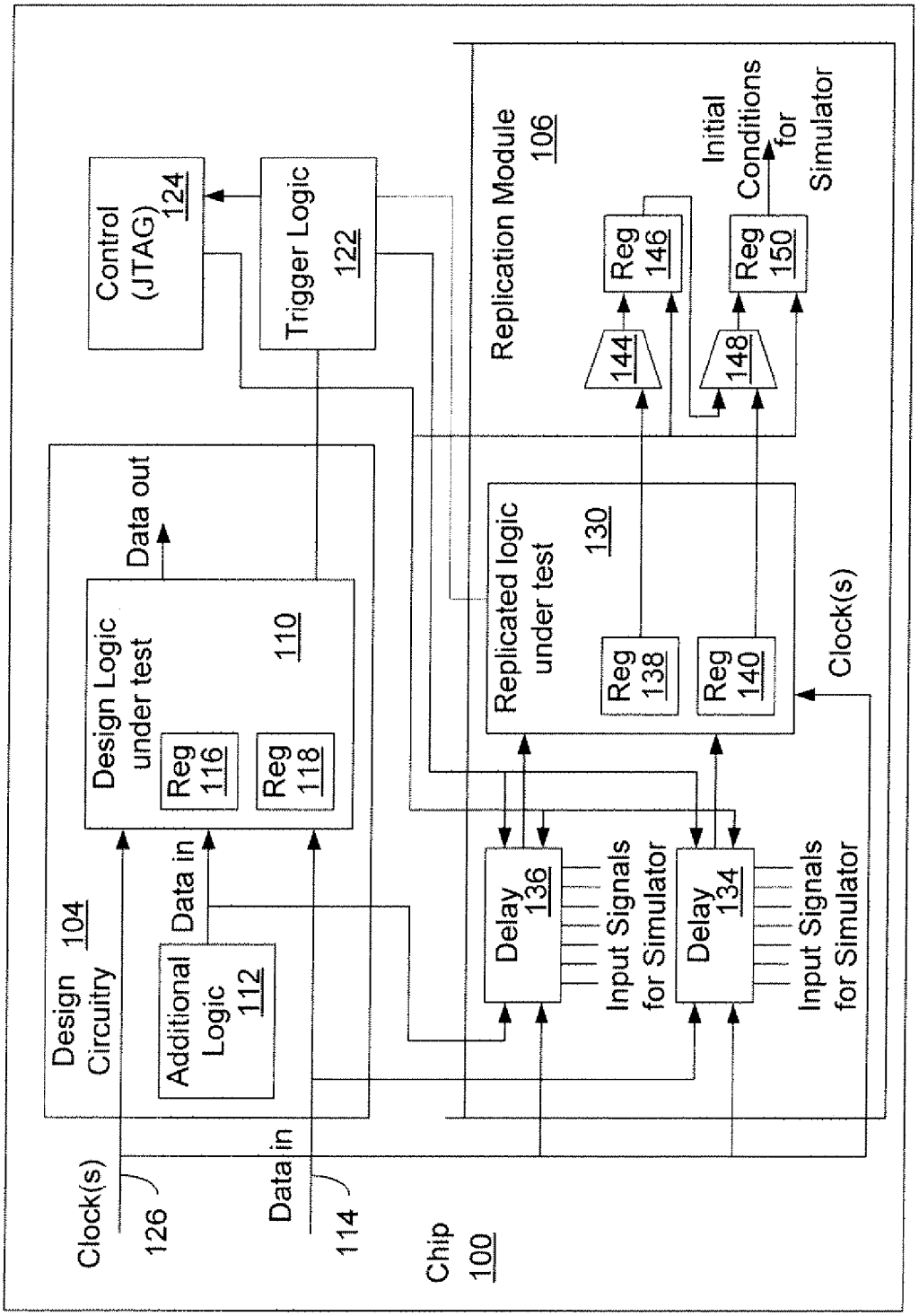
FIG. 6 is block diagram representation of logic and replicated logic with associated circuitry in a chip according to some embodiments of the inventions.

In operation, design logic 110 and replicated logic 130 each receive the same inputs, but replicated logic 130 receives a delayed version of the inputs. For example, design logic 110 receives input signals (including data in) from conductors 114 and additional input signals (including additional data in signals) from additional logic 112. Replicated logic 130 also receives the input signals from conductors 114 through delay circuits 134, and the additional input signals from additional logic 112 through delay circuits 136. In the example of FIG. 6, delay circuits 134 and 136 are FIFOs that have a width equal to the width of the input signals and a depth equal to a desired delay for a given type of situation and/or signaling. Design logic 110, design logic 130, FIFO 134, and FIFO 136 are clocked by one or more clock signals from conductor(s) 126. Logic 110 and 130 may be clocked by more than one clock signal even though FIFOs 134 and 136 are only clocked by one clock signal. There may be additional FIFOs that are not shown in FIG. 6 that are clocked by one or more other clock signals.

The input signals may include different types of signals including data, address, control, and other signals. Sometimes, these input signals are merely referred to as data signals although they may include more than merely traditional data. The design and replication modules can include memory and registers.

The program(s) of FIG. 3 (block 52) is used, for example, to design replication module 106. Different implementations of the program have different levels of designer participation. For example, in some implementations, the designer gives a command and the program generates the replication module. In other implementations, the designer gives more details about the replication module and in some implementation may interactively participate in the design of the replication module.

In operation, trigger logic 122 monitors design logic 110. When a particular event of interest called a trigger condition occurs, trigger logic 122 provides a trigger signal to FIFOs 134 and 136 which stops the FIFOs from responding to the clock signal. The trigger signal also goes to the replicated logic 130 to freeze the register values in registers 138 and 140. Trigger logic 122 also provides a signal to control circuitry 124 which causes control circuitry 124 to go into a control mode in which the contents of FIFOs 134 and 136 are made available as input signals for a simulator and certain contents of replicated logic 130 are made available as initial conditions for the simulator. Registers 138 and 140 may be chained to provide initial conditions. FIG. 6 shows an example in which registers 138 and 140, which are also affected by the trigger logic, provides initial condition signals through a multiplexer 144, registers 146, multiplexer 148, and registers 150 under the control of control logic 124. Multiplexer 144 may also receive an input of a JTAG chain. Control circuitry 124 may be JTAG control circuitry. Control circuitry 124 or other circuitry may take into account any time delay between the output of FIFOs 134 and 136 and the contents of registers 146 and 150. The circuit combination of multiplexers 144, 148, and registers 146, 150 only represent a specific way to get the initial conditions off the chip. Other circuitry could be used, such as serially scanning circuit for scanning and retrieving the register values in replicated logic 130.

Figure 7:
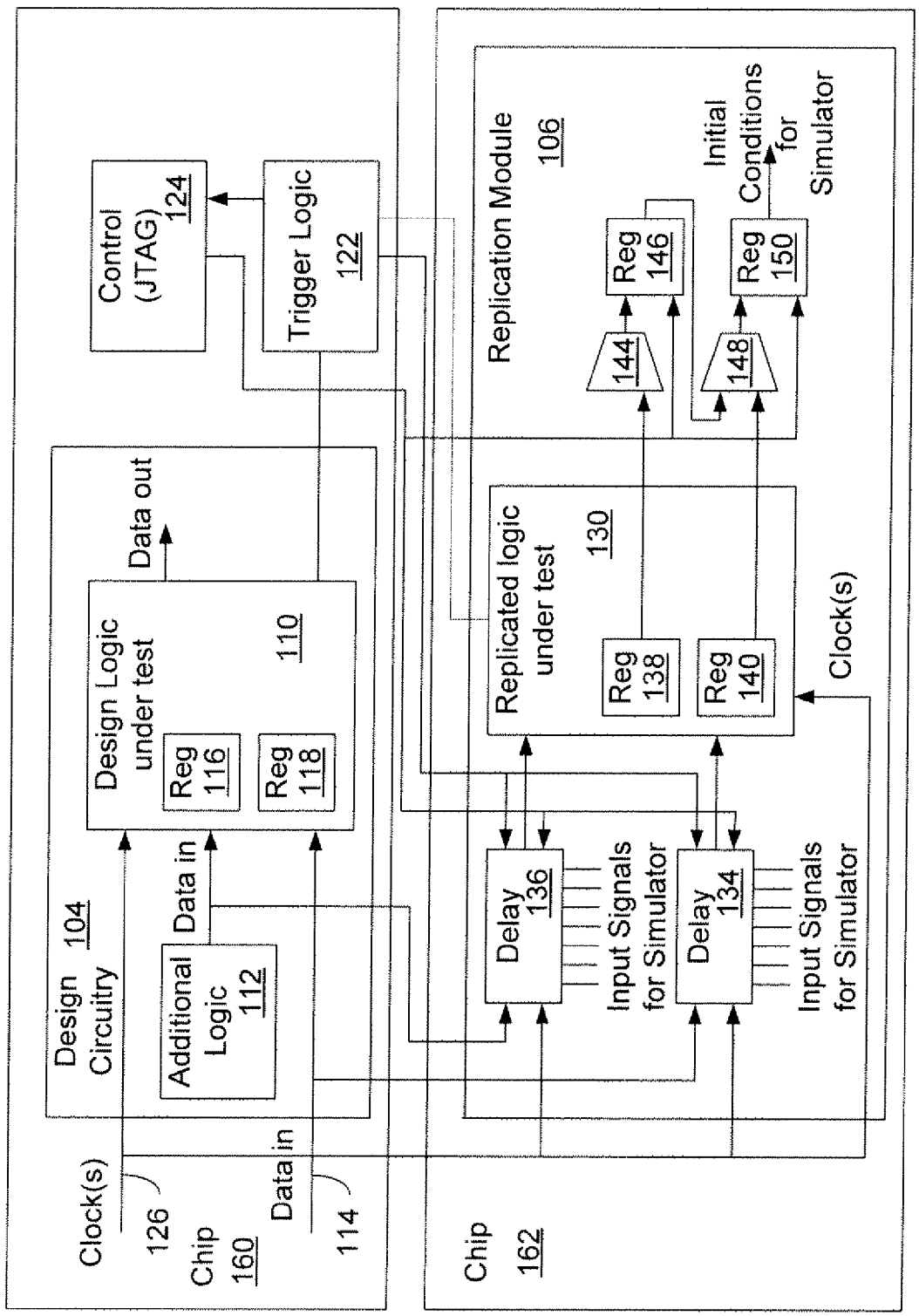
FIG. 7 is block diagram representation of logic and association circuitry in a chip and replicated logic and associated circuitry in another chip according to some embodiments of the inventions.

In an embodiment, the replicated module can be located in the same or different chip. FIG. 7 illustrates that design circuitry 104, trigger logic 122, and control circuitry 124 may be in a chip 160, while the replication module 106 may be in a chip 162. A reason to put the replication module in a different chip is there may not be enough room in chip 160 for it.

III. Additional Features for Some Embodiments

The following are some additional features that may be used in connection with some embodiments of each of the three main solutions (in sections II, IV, and V) unless indicated otherwise. However, other embodiments in each main solution do not include one, some, or all of these features. Further, some of these additional features also may be used apart from the main solutions.

A. Functional Equivalent but Different Replicated Circuit than Design Circuit In a preferred embodiment, the replicated module preserves the functionality of the design module utilizes a different circuit than the design module for facilitating debugging or for simplifying the replicated circuit. The replicated circuit can be different from the design circuit with a focus of gathering the conditions or inputs to help in analyzing the potential failure.

The replicated module can have freedom in circuit modifications to facilitate debugging. For example, circuit optimization can be suppressed in the replicated module. An objective of the replicated module is to provide initial conditions and inputs for debug simulations, thus seemingly extraneous circuitry in terms of efficiency can be actually needed for debugging purpose. In an aspect, hardware substitution is performed in a replicated module. For example, proprietary circuitry in the design module can be substituted with generic circuitry in the replicated module for ease of debugging. Hardware substitution can be particularly useful in providing access to unexposed states, which can be a difficult task for example, to get internal states of a black box in the design module. Access to unexposed states, such as internal states, can include providing control circuitry to retrieve the internal states of a module, such as the stored data in a memory. In another aspect, the design module can be partitioned so that the replicated module only contains a portion of the design module, or omits certain portions of the design module. The partitioning can further include a plurality of delay circuits provided to the replicated module from within the design module, for example, to address the various timing issues.

B. Correlating Initial Conditions to HDL Code in Simulator

Some embodiments involve correlating (that is, mapping or associating) values of at least some initial conditions from the chips with specific locations within the HDL code in the simulator. The specific locations may be objects in the HDL such as signals, registers, conductors, memories, etc. In some embodiments, this involves prohibiting sequential optimization within the compiler software used to correlate the HDL design into netlists. Examples of sequential optimizations that should be avoided include, but not limited to, retiming, pipelining, placement replication and state assignment. The compiler software used in correlating may generate a list of all memory and storage elements in the module in an order which can be correlated (mapped or associated) with a sequence in which the values for initial conditions are acquired by the simulator processor. The names of the memory elements can be directly correlated to signal instances compatible with the software simulator.

As an example is provided in connection with FIGS. 1, 6, and 9. One or more programs in computer 20 in FIG. 1 generate files, including in HDL code, to generate circuit functionality and layouts for the circuits of FIG. 6 (block 240 of FIG. 9). The same or another program(s) in computer 20 modifies and optimizes the functionality and layout designs (block 242 of FIG. 9). As used herein, the term optimize merely means to improve, not necessarily to reach a mathematical optimum. A chip including the circuitry of FIG. 6 is configured or fabricated (block 244 of FIG. 9). In response to a trigger signal, the initial conditions and input signals are gathered as described in connection with FIG. 6 and made available for the simulator program that may be run in computer 20 or another computer. A correlating technique or techniques are used to correlate the gathered initial conditions with specific locations within the HDL code in the simulator (block 246 (1) of FIG. 9). For example, the correlating may be a correlation between correlated (mapped) netlists for an FPGA with an HDL source code. Of course, there may be various intermediate and revised files between the blocks of FIG. 9.

Various heuristics may be used in the correlating technique(s). One such heuristic is naming of components of the circuits. A linkage between ordering of the initial condition states in scan chains and the name and location of the data's associated elements found in HDL code may be established. Source code may be used for all logic being replicated. In the case of black boxes, e.g., circuit blocks without detailed information of the inner devices, their outputs may be handled as additional inputs into the replicated design. Outputs from the black boxes in the original design may be run through FIFOs to those inputs in the replicated circuitry. A synthesis tool may support disabling retiming and sequential optimization on a per-module basis. Other embodiments do not include the details of this section or include variations of them.

Some embodiments provide a methodology to associate values of gathered initial conditions from the hardware with specific locations within the HDL code by prohibiting sequential optimization within the compiler software used to map the HDL design into netlists. The compiler software used in mapping will create a list of all memory elements in the module in an order which can be associated with sequence in which the values for the initial conditions are acquired by the processor. The name of the memory elements can be directly correlated to signal instances compatible with the software simulator.

C. Generating a List of Hardware Substitutions

Some embodiments involve associating values of gathered initial conditions from the hardware by generating a list of all hardware substitutions performed by the compiler in generating a netlist. The substitution list is used to trace back signal names and values from physical implementation to HDL level representations compatible with the software simulator. In an embodiment, a proprietary module can be replaced with an equivalent circuit. The equivalent circuit can facilitate debugging, for example, by providing access to unexposed states.

D. Access to Internal States

When a memory element is to be replicated, an exact duplicate might not be useful for debugging purpose because the original memory element usually does not have access to internal states. That is, the original memory has some unexposed states. The replicated memory typically will provide access to those states. The replicated memory can be a substituted memory (an example of a hardware substitution) because it includes additional structure to allow access to the unexposed states. A replicated memory can include a control circuitry to allow access to the memory data. A correlating (mapping) is provided to associate the substituted memory in the HDL code in the simulator. The flowchart of FIG. 9 may apply with part (2) of block 246 in particular.

FIG. 10 illustrates a substituted memory. Replicated Random Access Memory (RAM) 254 may be the same as a design (original) RAM. Control circuitry 252 freezes RAM 254 after a trigger condition and also allows the contents of RAM 254 to be clocked out through scan chains 256 to provide, for example, serial data out to a controlling computer. Addresses from the replicated module and data from the replicated module are provided to the control circuitry 252 and RAM 254. In some embodiments, when needed, a synthesis tool can call a function in, for example, a C library that will then return a pointer to a netlist containing the substitute RAM design.

Some embodiments include circuitry and a method to handle various forms of RAM in the replicated logic by substituting special RAM structure containing access control logic, such as control circuitry 252 in FIG. 10. The access control logic allows the specialized RAM structure to operate like normal RAM when all the normal read/write signals and clocks are enabled. The access control logic allows the operation of the RAM to be frozen once the trigger condition has been detected. The access control logic then allows the contents of the RAM to be scanned out to the controlling computer. The access control logic can also include a scan chain to allow serial output of the content of the RAM. The RAM contents are used to gather initial conditions of the RAM for software simulation. Other embodiments do not include the details of this section or include variations of them. For example, RAMs can also be treated like black boxes. The outputs of the RAMs can be fed in to delay FIFOs which are feeding the replicated module similar to the input. This approach is preferable in case the RAM structures, for example, BlockRAM, cannot be inferred.

Some embodiments include circuitry and a method to handle various basic proprietary logic modules (for example, Xilinx SRL16 shift registers and Altera Altshifttap shift registers) in replicated logic. This includes substituting these proprietary modules with logical equivalent circuits that allow access to the internal states of those modules. These internal states can be scanned by a computer and used as initial conditions during software simulation. For example, a Xilinx SRL16 shift register, represented as a proprietary module with input and output pins for connection to external circuitry can be substituted with a functional equivalent circuit with accessible internal states. Other embodiments do not include the details of this section or include variations of them.

E. Formal Verification Flow Techniques

In the past, formal verification flow techniques have been used to confirm that actual designs match the description in HDL code. Some embodiments involve associating values of initial conditions from hardware by using formal verification flow techniques. An example is provided in FIG. 9, with block 246 (3) in particular. Other embodiments do not include this feature or include a variation of it.

F. Partitioning

In an embodiment, the replicated module comprises additional delay circuits from within the design module to the respective locations of the replicated module. For example, a first delay circuit connects the input of the design module to the input of the replicated module. A second (and optional others) delay circuit can connect from any location of the design module to the appropriate location in the replicated module. The additional delay circuits can provide accurate timing between the modules, especially for multiple clock domains.

In some embodiments, the design module is partitioned into a plurality of design segments. In an aspect, the design segments can all be replicated, with each replicated segment connected to its respective design segment through a delay circuit. In another aspect, only a portion of the design segments are replicated, with each replicated segment connected to its respective design segment through a delay circuit. The portions of the design segments can be separated or embedded within each other in the design module. In another aspect, at least one portion of the design segments is not replicated, and each design segment being replicated provides an output signal to a delay circuit wherein the output of the delay circuit is provided to the respective location of the replicated segment.

G. Black Boxes

Figure 20:
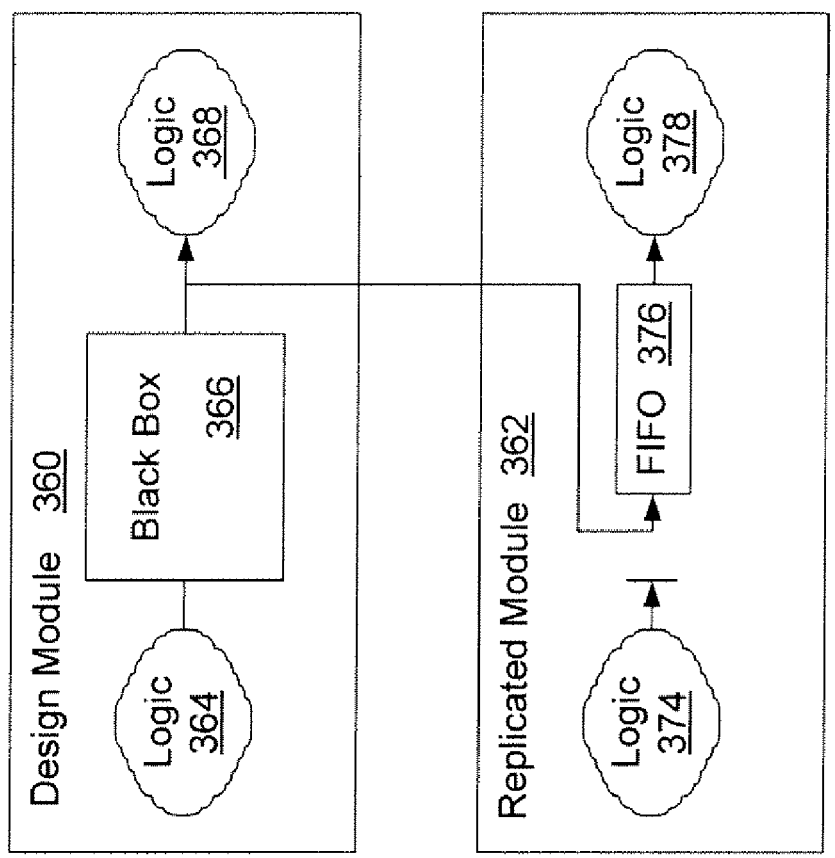

The design module can be partitioned into segments with at least one segment, for example, a black box module, not being replicated. Circuit design often includes black boxes, e.g., modules with no knowledge of internal states or behavior, such as IP block or proprietary logic modules. Some embodiments of the present invention include circuitry and a method to handle black boxes and various proprietary logic modules without the need of detailed inner circuit. In some embodiments, proprietary logic with unknown behavior is not copied into the replicated logic. Instead, this method treats the outputs of the proprietary module in the design module as additional inputs to their respective locations within the replicated logic. For example, FIG. 20 includes a design module 360 and a replicated module 362. Design module includes logic 364, the output of which is provided to a black box 366. Black box logic 366 is circuitry that performs various functions which are not known, although the input and output signals are known. The output of black box logic 366 is provided to logic 368 in design module 360 and also to a delay circuit FIFO 376 in replicated module 362 to account for the overall replicated logic delay. The output of FIFO 376 is provided to logic 378. In this respect, the black box logic 366 is not directly replicated in replicated module 362. In the example of FIG. 20, the outputs of logic 374 are not provided to logic 378. In some embodiments, logic 374 is not replicated and the outputs of FIFO 376 are connected to their respective input locations within the replicated module. In response to a trigger condition, the contents of the FIFO 376 are acquired by the computer and used to simulate the outputs of the proprietary logic 366 in the software simulation. In an embodiment, a delay circuit (not shown) is provided to connect the input of logic 364 with the input of replicated logic 374. Other embodiments do not include the details of this section or include variations of them.

H. Multi-Clock Domains

Figure 18:
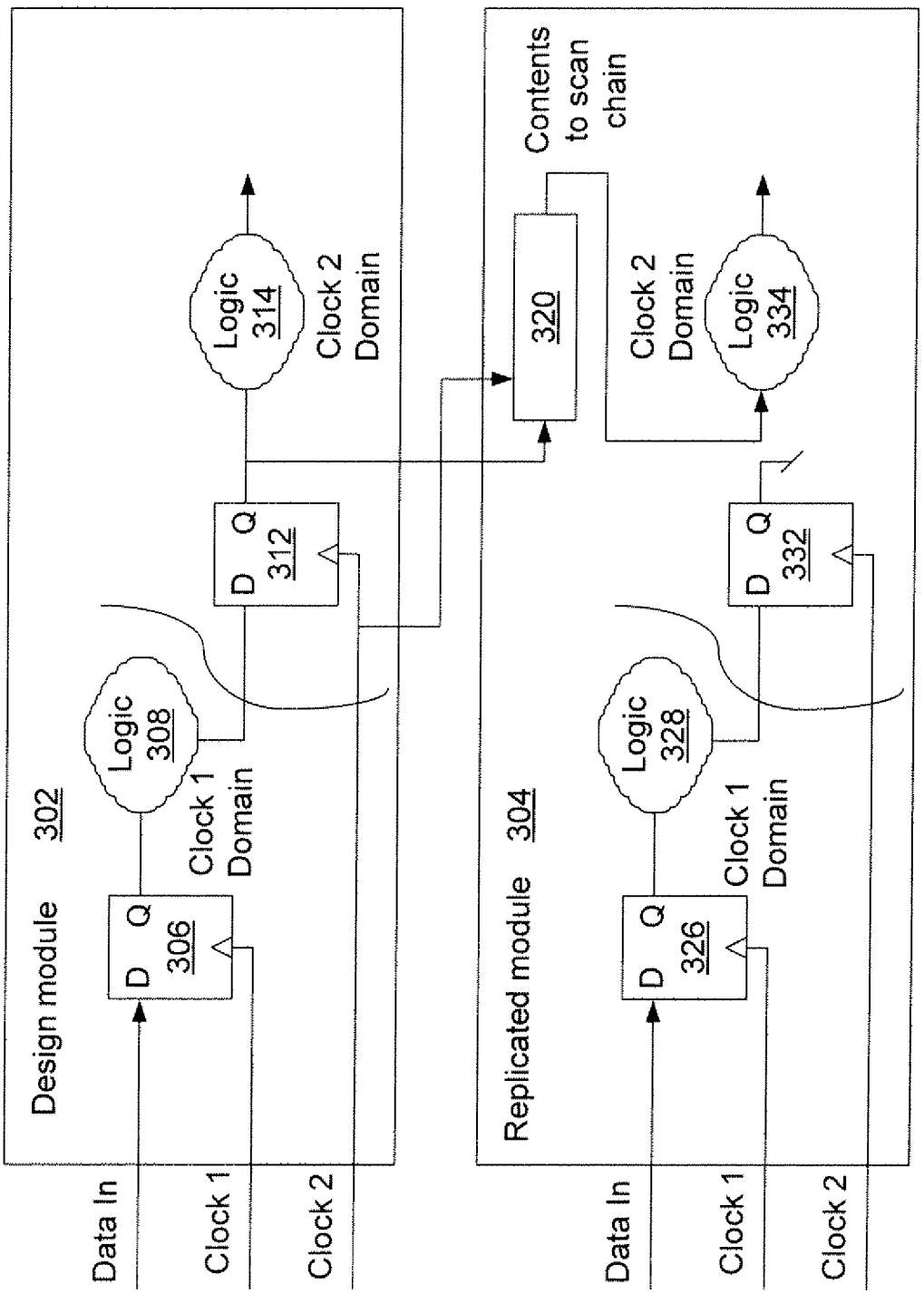
FIGS. 18-20 are each a block diagram representation of a design module and a replicated module and associated circuitry according to some embodiments of the inventions

The design module can be partitioned based on clock domains with each clock domain receiving a separate delay input. Some embodiments include circuitry and a method to handle the timing of data transfer between two logic circuits clocked by two discrete asynchronous clocks. This circuit and method may include the use of a "synchronizer flip-flop" to feed a FIFO whose depth can be determined by the relative frequencies of the two clocks. FIG. 18 shows a synchronizer flip-flop 312 in design module 302. The circuitry and method can be expanded to be used to synchronize one or more signals crossing between any numbers of clock domains.

Many designs use multiple independent clocks. Timing issues arise when signal paths cross over between one clock domain and another clock domain. FIG. 18 illustrates an example where a signal goes from a clock 1 domain to a clock 2 domain. In design module 302, a data signal is received by a flip-flop 306 clocked by a clock 1. The output of flip-flop 306 is provided to logic 308, which is part of the clock 1 domain. Of course, there could be many more data signals in parallel. Accordingly, flip-flop 306 and flip-flop 312 each represent multiple parallel flip-flops. The output of logic 308 is provided to synchronizer flip-flop 312 which is clocked by clock 2. The output of flip-flop 312 is provided to logic 314, which is part of the clock 2 domain.

A replicated module 304 also receives clocks 1 and 2 so that the data to the replicated module accurately emulates the data in the design module. Replicated module 304 includes a flip-flop 326 that receives data and is clocked by clock 1. The data may be the data that is received by flip-flop 306 and it may or may not be delayed by a delay circuit (not shown). The output of flip-flop 326 is provided to logic 328, which is part of the clock 1 domain. The output of logic 328 is provided to a synchronizer flip-flop 332 which is clocked by clock 2. All signals crossing the clock domain boundary are recognized by the synthesis tool.

In the example of FIG. 18, the output of synchronizer flip-flop 332 is not passed to logic 334, which is part of the clock 2 domain (clocked by clock 2). However, in some embodiments, the output of flip-flop 332 is used to gather the state of the circuit, for example as an indication of the contents of register 312. In some embodiments, synchronizer flip-flop 332 is not included.

Signals crossing the clock domain use synchronizer 312 in design module 302. The output of flip-flop 312 is provided to logic 334 after it is delayed by a FIFO 320, which is clocked by clock 2. This insures that logic 334 will get the same data as logic 314. In response to a triggering condition, FIFO 320 is frozen so as to not accept new data and its contents can be scanned as part of a scan chain to obtain input signals for the simulator. Initial condition signals can be obtained from registers and memory in logic 334.

The FIFO may be clocked by the same clock as the data being clocked into the FIFO. The depth of the FIFO for one clock domain may be different from another FIFO in another domain. The depth may be calculated to provide the same amount of delay in time for all clocks in all domains. The FIFOs used to carry signals across clock domains may be frozen once the trigger condition is detected. The contents of the FIFOs may be clocked out to a scan chain for use in the simulations.

Figure 19:
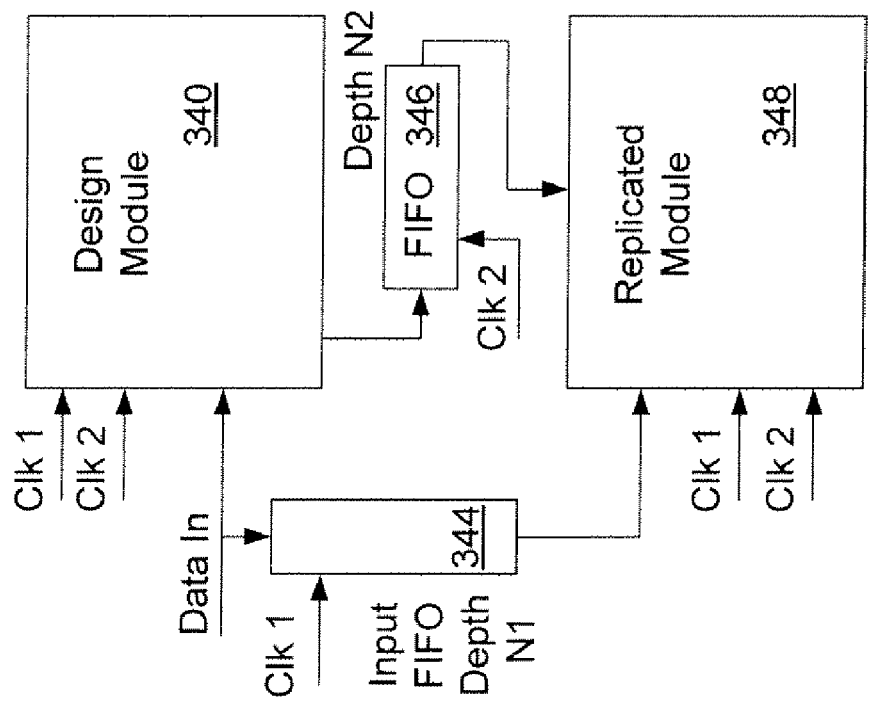

When there are multiple clocks within a design, specific guidelines may be followed to insure that the timing between domains is correct. For example, in FIG. 19, a data signal is clocked into a design module 340 by a clock 1 signal (clock 1). Within design module 340 and a replicated module 348, there is a clock domain running off of a clock 2. The data signal is also provided through an input FIFO 344 of depth N1 to replicated module 348. Data from design module 340 is provided through an inter-domain FIFO 346 of depth N2 to replicated module 348. The total delay for replicated module 346 may depend on both the period of clock 1 and the depth N1 of the input FIFO 346. Typically, the total delay of a delay circuit is inversely proportional to the period of the clock. A goal for inter-domain FIFO 346 may be to provide the delay described as follows. Assuming the clock 2 period is known, the depth N2 can be calculated as follows. If P1 is the period of clock 1 and P2 is the period of clock 2, a goal may be to derive an N2 so that:

$(P1 \times N1)/(P2 \times N2)=1$ or as close to 1 as is practical.

If $P1 \times N2$ is evenly divisible by P2, then:

$N2=(P1 \times N1)/P2.$

Otherwise, N2 may be the modulus portion of:

$N2=((P1 \times N1)/P2)+1.$

N2 may have a sufficient amount of delay to compensate for the delay introduced by the input FIFO. However, there still may be an ambiguity with respect to what the data looks like from the output of FIFO 346. Depending on the relative alignment of the two clocks at the beginning of the simulation, the replicated hardware in the clock 2 domain may need to be clocked one more time. If the following criteria are met, then clock 2 may need to be clocked one more time for replicated module 348. Let Y be a number:

$Y=((P1 \times N1)/P2)+1.$

Let T represent a time period:

$T=\text{fract}(Y) \times P2,$ where fract (Y) is the fractional portion of Y. Then, given a delay D where T<D<P2, the hardware clock 2 may need to be clocked one more cycle. Otherwise, whenever D falls between 0 and T, the additional clocking may not be necessary.

The relationship of the active edges of clocks 1 and 2 may not be able to be determined until after a capture has been completed. Therefore, the following sequence may be followed: start process; trigger condition happens; determine phase relationship of the clock; pulse clock 2 if the delay conditions for clock 2 are met; and gather the state of registers and RAM. Other embodiments do not include the details of this section or include variations of them.

I. Sampling a Slower Clock with a Faster Clock

Some embodiments include circuitry and a method to calculate the relationship between two discrete asynchronous clocks by directly sampling a slower clock with a faster clock in the design. If the frequency and the duty cycle of each clock are known, the relationship between one clock and the other may be calculated by adjusting the offset of the slower clock to match the sampled data pattern. This process can be used to determine the relationship between two or more clocks. Each slower clock signal is compared with the fastest (highest frequency) clock signal. Note that although the clocks are generally asynchronous, in particular cases, it could turn out that two or more of the clocks are synchronous—but the circuitry and method do not require it.

Figure 12:
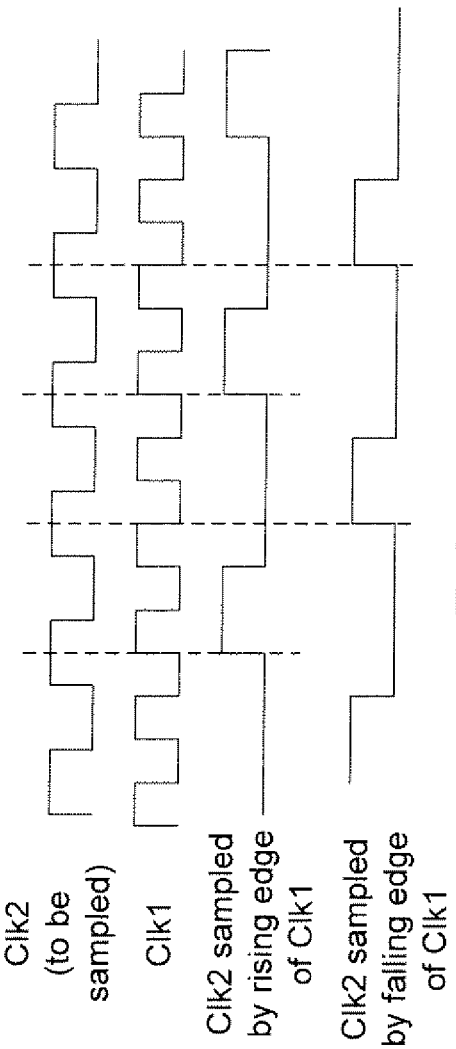

In multi-clock designs, the frequency of each clock is known. A synthesis tool may provide this information for each domain. The relationship of the active clock edges with each other at the beginning of the data capture is not known. For example, in FIG. 6, assume clock signal (clock) 1 and clock signal (clock) 2 of FIG. 12 are provided on conductors 126 to design logic 110 and replicated logic 130. At a time t0, when the clocks and data on conductors 126 and 114 are provided to design logic 110, clocks 1 and 2 have a particular phase relationship. One way to express this phase relationship is the time between a rising edge of clock 1 and the next following rising edge of clock 2. At time t0+delay, the data on conductors 114 reaches replicated logic 130 through delay circuit 134. At time t0+delay, the phase relationship between clocks 1 and 2 on conductors 126 will ordinarily be different than at time t0.

The phase relationship can be approximated by analyzing the clock edges for each of the clock by sampling those clocks with the fastest clock in the design. The clock samples can be stored in a FIFO which can be scanned and analyzed by an analyzing logic or module, such as a circuit, a simulator or other software. In most cases, increasing the number of samples will reduce the window of ambiguity surrounding an edge. Sampling a clock may be handled in different ways. In the case in which all clocks have, for example, at least approximately a 50% duty cycle, the sampled clock is sampled directly by the fastest clock and the results placed into a FIFO. For increased accuracy, the clocks may be sampled on both the rising and falling edges of the fastest clock.

Figure 11:
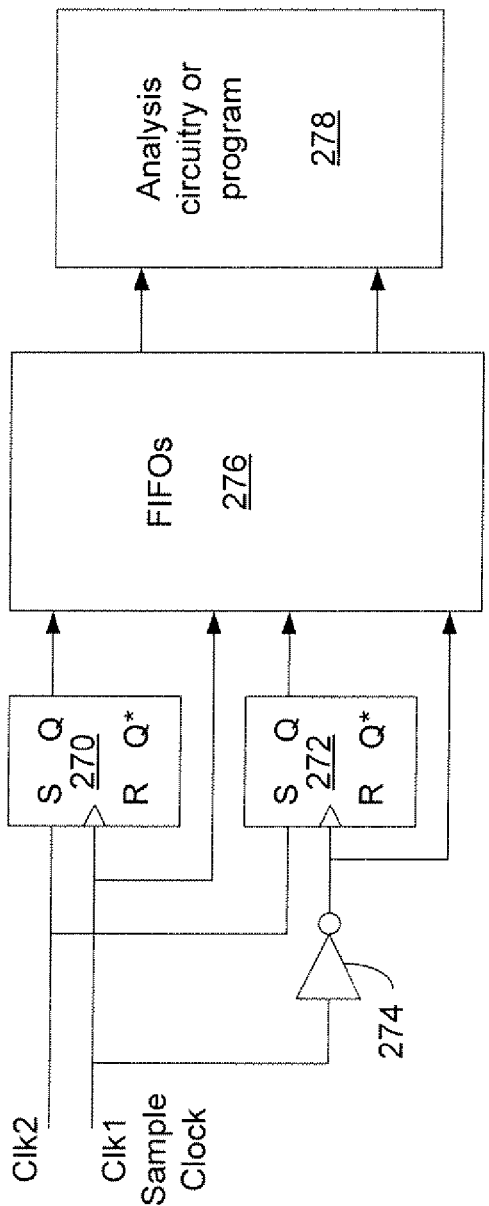
FIG. 11 is a block diagram representation of a system for determining a phase relationship between asynchronous clock signals according to some embodiments of the inventions.

For example, in FIG. 11 flip-flops 270 and 272 receive clock 2 as inputs. Flip-flop 270 is clocked by clock 1 and flip-flop 272 is clocked by an inverted clock 1 through an inverter 274 so that flip-flop 270 samples clock 2 on the rising edge of clock 1 and flip-flop 272 samples clock 2 on the falling edge of clock 1. The sampled values in flip-flops 270 and 272 are clocked into FIFOs 276 that may be scanned and analyzed by an analyzing logic or module such as a circuitry or a program 278 to determine the clock placement. There may be additional circuitry between FIFOs 276 and circuitry or program 278.

FIG. 12 provides an example of clocks 1 and 2, and clock 2 sampled by the rising and falling edges of clock 1. The circuitry and method of the present claims may include more than two clocks. For example, a clock 3 similar to clock 2, but out of phase with clocks 1 and 2 (and perhaps also at a different frequency) may be sampled by clock 1 in the same fashion as clock 2 is. The phase relationship of the first and second clock signals is ascertained as explained above as the relationship was at least one particular time (for example, a first time). The phase relationship of the first and third clock signals is ascertained for at least one particular time (for example, a second time, which may be the same as or different than the first time). Other embodiments do not include the details of this section or include variations of them.

J. Sampling a Signal Generated from a Slower Clock with a Faster Clock

Some embodiments include circuitry and a method to calculate the relationship between two discrete asynchronous clocks by detecting each of the edge transitions of the slower clock within a sampling period of the faster clock. If the frequency and the duty cycle of each clock are known, then the relationship between one clock and the other can be calculated by adjusting the offset of the slower clock to match the detected edge data pattern. This circuitry and method can be used to determine the relationship between 2 or more clocks.

This second way to handle clocks may be applicable where the clock to be sampled has, for example, substantially less than a 50% duty cycle. If the duty cycle is too small, the sampler of FIG. 11 might not be able to find some samples or even a single sample. For example, FIG. 13 shows a clock 1 and a clock 2 which has far less than a 50% duty cycle. If clock 2 was sampled by clock 1 in the circuitry of FIG. 11, the result might be as shown in FIG. 13, where the output is constant because the duty cycle of clock 2 is too narrow to be captured by clock 1. No valid data is captured that can be used to align the clocks.

In contrast to the circuitry of FIG. 11, instead of sampling the clock directly, the clock can be used to drive, for example, a divide by two circuit as in FIG. 14. This results in a signal that changes state only when an active edge is detected. Referring to FIG. 14, the negative (Q*) output of a flip-flop 282 clocked by clock 2 (Clk2) is fed back to its input. The positive (Q) output of flip-flop 282 is provided as the input to a flip-flip 284, which is clocked by clock 1. The output of flip-flop 284 is provided as the input to flip-flop 286, which is also clocked by clock 1, and to an exclusive-OR (XOR) gate 288. The Q output of flip-flop 286 is also provided to XOR gate 288. The output of XOR 288 is provided to a FIFO for later analysis. The output of XOR gate is high when an active clock 2 edge occurs during a sampling cycle of clock 1. This produces results as shown in FIG. 15 which shows that every active edge of clock 2 maps to a positive level output clocked from the clock 1 domain. Accordingly, the circuitry of FIG. 14 is independent of the duty cycle of clock 2. There may be one or more additional clock signals that are also compared with the clock 1 (the highest frequency clock). The additional clock signal(s) may be out of phase and perhaps of a different frequency than the other clocks. FIG. 14 could be modified to include additional flip-flops so that the circuitry responds to both the rising and falling clock edges. Some chips could have multiple samplers, some like in FIG. 11 and some like in FIG. 14. Other embodiments do not include the details of this section or include variations of them.

Figure 16:
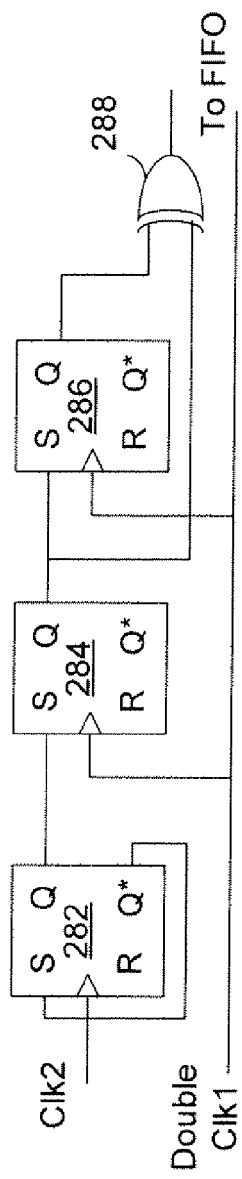
FIG. 16 is a block diagram representation of a system for determining a phase relationship between asynchronous clock signals according to some embodiments of the inventions.
Figure 17:
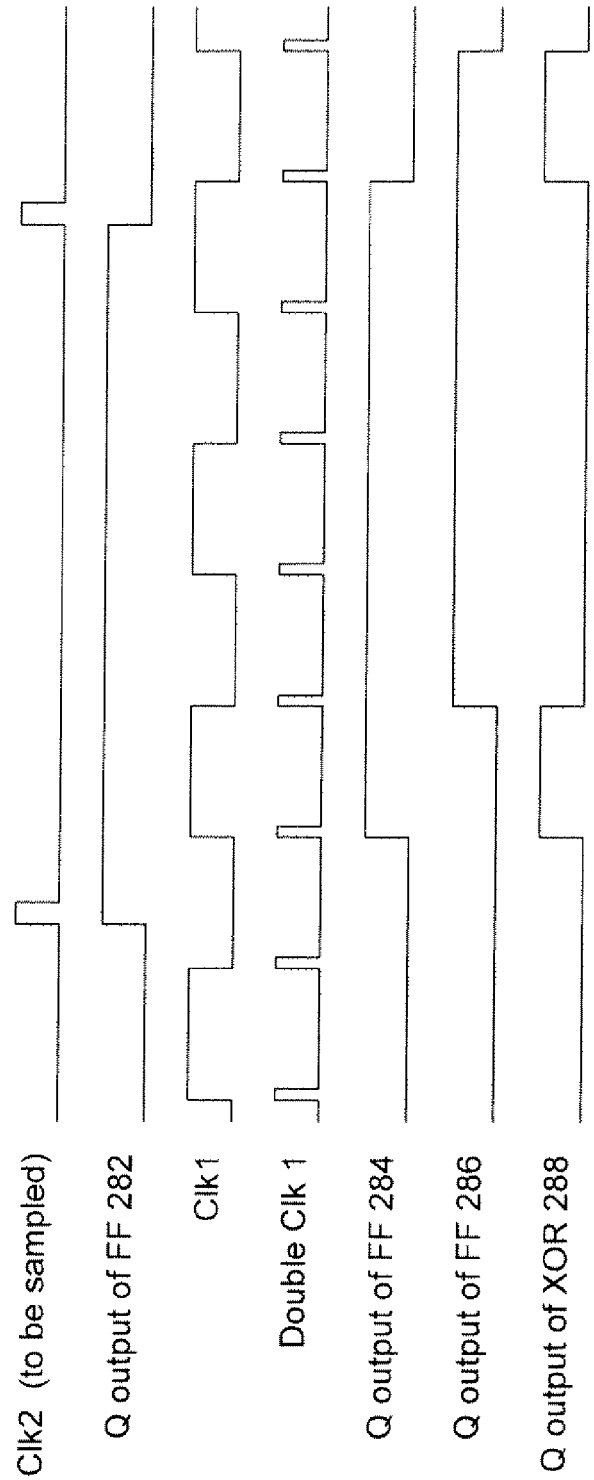
FIG. 17 is a timing diagram for the system of FIG. 16.

FIGS. 16 and 17 show an alternative to FIGS. 14 and 15. Referring to FIGS. 16 and 17, double clock (Double Clk1) is a pulse on the rising and falling edges of clock 1 (clk1). FIG. 16 is similar to FIG. 14 except that Double Clk1 is provided to the clock inputs of flip-flops 284 and 286. A resulting timing diagram is shown in FIG. 17 with a Clk2 positive edge detection using Double Clk1. Negative edge detection could also be used. In different embodiments of the circuits (such as those of FIGS. 11, 14, and 16 and other circuits shown in this disclosure), the circuits may be modified such that samples are made at rising transitions of a clock signal, at falling transitions of the clock signal, or at rising and falling transitions of the clock signal depending on the embodiment. That is, in some embodiments, the samples are made at rising transitions; in other embodiments, the samples are made at falling transitions, and in still other embodiments, the samples are made at rising and falling transitions.

K. Replication in Separate FPGA or ASIC

Some embodiments include a method (such as in FIG. 3) to implement the replicated portion of the logic in a separate FPGA or ASIC device. For example, in FIG. 6, replicated module 130 is in the same chip as design logic 110, whereas in FIG. 7, replicated module 130 is in a different chip than design module 110. The method does not apply merely to replicate from one chip to another chip, but may apply to replicate from multiple chips to multiple additional chips (for example, 2 chips to 4 chips, 3 chips to 6 chips, etc.). In other embodiments, the replicated portions of circuits from multiple chips could be placed in a single chip or in fewer than the number of original chips. For example, the replicated portions of circuits in 2 chips could be both placed in one additional chip, or the replicated portions of circuits in 4 chips could be placed in 1, 2, or 3 chips depending on the implementation. Other embodiments do not include the details of this section or include variations of them.

IV. Snapshot Solutions

As mentioned above, various snapshot solution techniques can be used to obtain initial condition signals and input signals for simulation. The snapshot solutions do not require a complete replication of the logic being debugged, and typically involve storing a snapshot of selected design registers at regular intervals. One approach creates a series of debug storage registers (snapshot registers) with a predetermined depth for the storage element in the design module. Each storage element in the original design module is connected to a set of newly created storage elements. On a periodic basis, the values for the storage elements in the design module are strobed into the snapshot registers. The data in the snapshot registers contains the initial conditions for the registers in the design module under test at a determinable time before a trigger condition occurs. This data is then gathered and provided as input to a software simulation program for debugging. The following describes some implementations of the snapshot solutions.

FIG. 21 illustrates a chip 414, which is an example of chip 14 in FIG. 1 or chip 38 in FIG. 2. Referring to FIG. 21, chip 414 includes design memories and replication memories 426, design registers and snapshot registers 428, and input FIFOs 430 which in operation receive input signals from logic 422-1 . . . logic 422-N. The input signals may include various types of signals including data, address, control, and enable signals. Clock signals are included but shown in other drawings. In response to a trigger condition (or event), such as an error or other designated condition, triggering logic 418 provides a trigger signal(s) that causes some or all units in memories 426, registers 428, and FIFOs 430 to freeze their operation. As is explained in detail below, memories 426 and registers 428 provide initial conditions through signals TdoMs and TdoRs, and FIFOs 430 provide input signals in response to signals from JTAG control 420 through, for example, interface 16 to computer 20 (in FIG. 1) for use by the simulator. In one aspect, the replicated memory contains memory data delayed by a delay memory input FIFO, meaning the contents of the replicated memory is the contents of the design memory at a number of clock cycles earlier, which is the length of the memory input FIFO. In another aspect, the snapshot registers contain the snapshot data of the design registers at a regular interval, which is controlled by a snapshot pulse.

There are various ways to implement the trigger signal action. For example, the trigger signals may include multiple signals each of which freeze different components. An advantage of having multiple signals is that they may be asserted for different lengths of time.

FIG. 22 illustrates design and replication memory units 434-1 . . . 434-N in design memories and replication memories 426 that receive input signals 1 . . . input signals N as wells as clock, trigger, and JTAG signals. The clock signals may be the same for each memory unit or different for some or all of the memory units. Likewise, the trigger and JTAG signals may be the same for each memory unit of different for some or all of the memory units. Memory units 434-1 . . . 434-N provide output signals TdoM1 . . . . TdoMN, some or all of which may be used to provide initial condition signals.

FIG. 23 illustrates design and snapshot register units 436-1 . . . 436-N in design registers and snapshot registers 428 that receive input signals 1 . . . input signals N as well as clock, trigger, and JTAG signals. The clock signals may be the same for each register unit or different for some or all of the register units. Likewise, the trigger and JTAG signals may be the same for each register unit of different for some or all of the register units. Register units 436-1 . . . 436-N provide output signals TdoR1 . . . . TdoRN, some or all of which may be used to provide initial condition signals. Note that the inputs into memory unit 434-1 do not necessarily match the inputs into register unit 436-1. Further, the value of the letter N in FIGS. 21, 22, and 23 are not necessarily the same and in practice would typically be different. For example, N in FIG. 23 could be much larger than N in FIGS. 21 and 22. Initial condition signals may be provided from many registers in addition to those illustrated.

FIGS. 21, 22, and 23 are schematic in nature to communicate some aspects of some embodiments, not to provide a complete circuit layout. There may be intermediate circuits between those components that are illustrated in FIGS. 21, 22, and 23. For example, the same signals from logic 422-1 would not necessarily be applied directly to both memories 426 and registers 428. Other embodiments include different details.

The snapshot solution works with memories and registers that receive clocks signals with the same frequency or that receive clocks with different frequencies. The following are examples of chip 414 in FIG. 21 in the case in which some of memory units, register units, and FIFOs of memories 426, registers 428, and FIFOs 430 receive different clock signals than others of the memory units, register units, and FIFOs of memories 426, registers 428, and FIFOs 430. In the following examples, clock A has a higher frequency than clock B.

Figure 24:
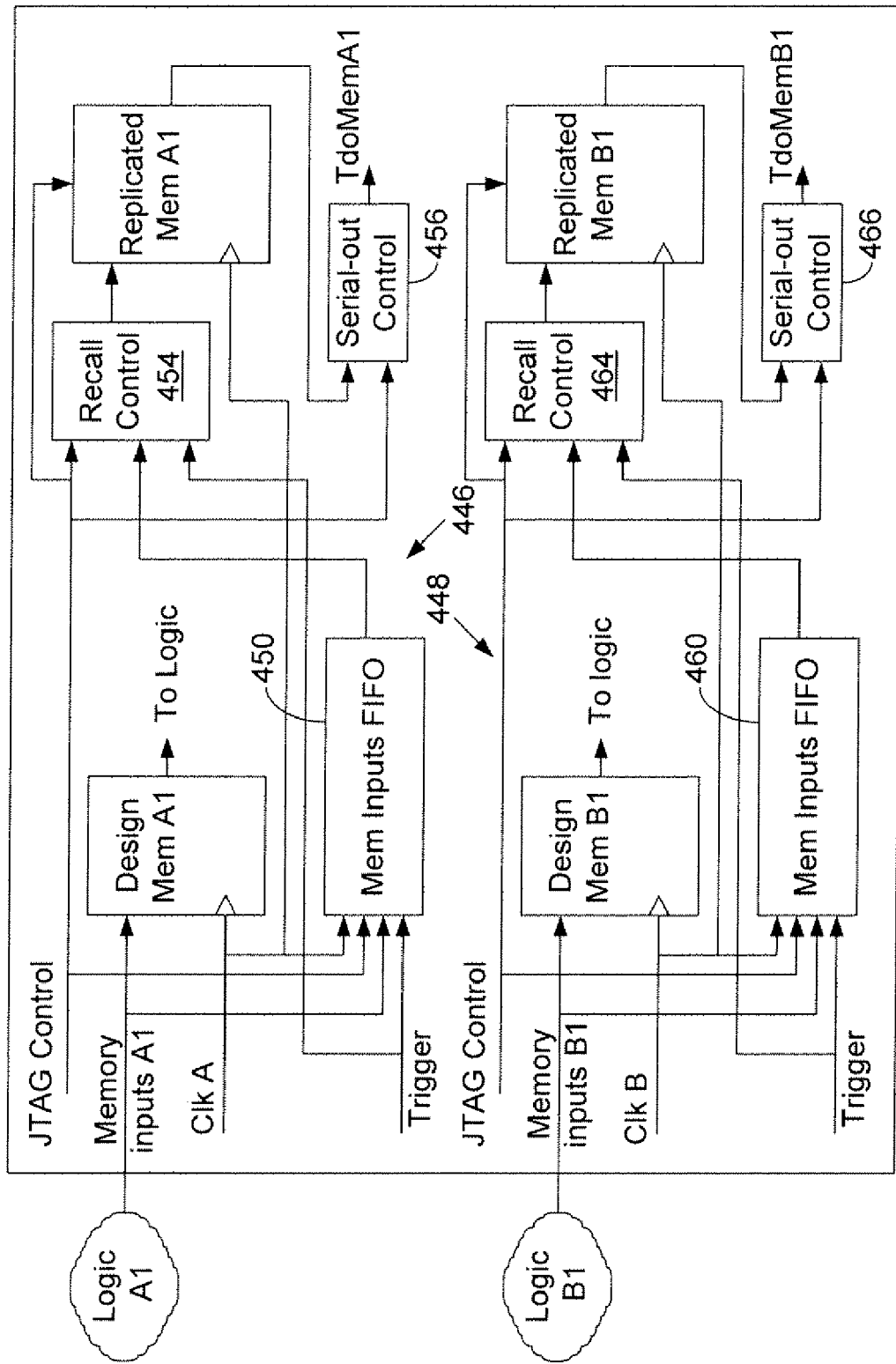
FIG. 24 is a block diagram representation of an example of a portion of the circuitry of FIG. 22 according to some embodiments of the inventions.

FIG. 24 provides an example of design and replication memory units 446 and 448, which are examples of two of units 434-1 . . . 434-N in FIG. 22. Memory unit 446 includes a design memory A1, memory input FIFOs 450, recall control circuitry 454, replicated memory A1, and serial-out control circuit 456. Memory unit 448 includes a design memory B1, memory input FIFOs 460, recall control circuitry 464, replicated memory B1, and serial-out control circuit 466.

Design memory A1 and FIFO 450 receive memory input signals from logic A1, which is one or more of logic 422-1 . . . 422-N of FIG. 21. Design memory A1 and FIFO 450 are clocked by clock A. Before a trigger condition, replicated memory A1 is also clocked by clock A. Recall control circuitry 454 receives the signals from FIFO 450 and passes it to replicated memory A1. The depth of FIFO 450 can be the maximum recall look back length, which is the maximum number of cycles that can be looked back, although as explained below, the actual number of cycles that are looked back may be less than the maximum look back length. In an aspect, the maximum recall look back length is the interval of the snapshot pulse, representing the cycle of the snapshot register content. However, the trigger signal can happen at anytime between the two snapshot pulses, thus the number of clock cycles that can look back varies between 1 and the maximum recall look back length. To ensure of a minimum number of look back cycles, the snapshot registers are designed in two stages (see FIG. 25 and description below), and the depth of FIFO 450 is twice the maximum recall look back length. For example, for a snapshot pulse cycle of 1000 cycles of clock A with a twice maximum recall look back length FIFO and two stage snapshot registers (stage 1 storing snapshot content of 1000 clock earlier, and stage 1 storing snapshot content of 2000 clock earlier), signals pass through FIFO 450 in 2000 cycles of clock A. With this design, stage 1 snapshot content stores values of a clock cycle between 1 and 1000 clock cycles before the trigger. Stage 2 snapshot content stores values of a clock cycle between 1000 and 2000 clock cycles before the trigger. Replicated memory content stores design memory content at 2000 clock cycles before the trigger.

As used herein, a "clock cycle" does not necessarily equal the period of the clock cycle. For example, in a double data rate system, there may be two clock cycles per clock period and in a quad data rate system, there may be four clock cycles per clock period, depending on the implementation. However, this is implementation specific. In some implementations, even with a double data rate or quad data rate clock, the clock cycle could equal the period of the clock signal.

Likewise, design memory B1 and FIFO 460 receive memory input signals from logic B1, which is one or more of logic 422-1 . . . 422-N of FIG. 21. Design memory B1 and FIFO 460 are clocked by clock B, which in this example has a lower frequency than clock A. Before a trigger condition, replicated memory B1 is also clocked by clock A. The depth of FIFO 460 is chosen to be proportional to the frequencies of clock B and clock A so that signals pass through FIFO 460 in the same amount of time that signals pass through FIFO 450 (although depending on the frequency and depth of FIFO 450, it may not be possible for them to pass through in exactly the same amount of time). Recall control circuitry 464 receives the signals from FIFO 460 and passes them to replicated memory B1. FIFOs 450 and 460 may have a width equal to the width of inputs A1 and B1, respectively.

Note that design memories A1 and B1 and replication memories A1 and B1 do not necessarily have signals written into them with every cycle of clocks A and B, but only for those cycles when other conditions are met, such as there being a command to write to the memories. The memories may have enable inputs (not shown). Accordingly, memory input signals A1 and B2 do not necessarily have signals to be written into the memories with each clock cycle.

When a trigger condition occurs, triggering logic 418 (in FIG. 21) provides a trigger signal that causes FIFOs 450 and 460, recall control circuits 454 and 464, and replicated memory A1 and B1 to freeze (no longer respond to clocks). In the example, at the time the components are frozen, replicated memory A1 is 2000 clocks behind design memory A1 and replicated memory B1 is a number of clocks behind design memory B1 as discussed. As will be described below, the JTAG signals cause some or all of contents of replicated memories A1 and B1 to be written through serial-out control circuits 456 and 466 as TdoMemA1 and TdoMemB1 signals which are examples of signals TdoM1 . . . . TdoMN signals in FIG. 22.

Figure 25:
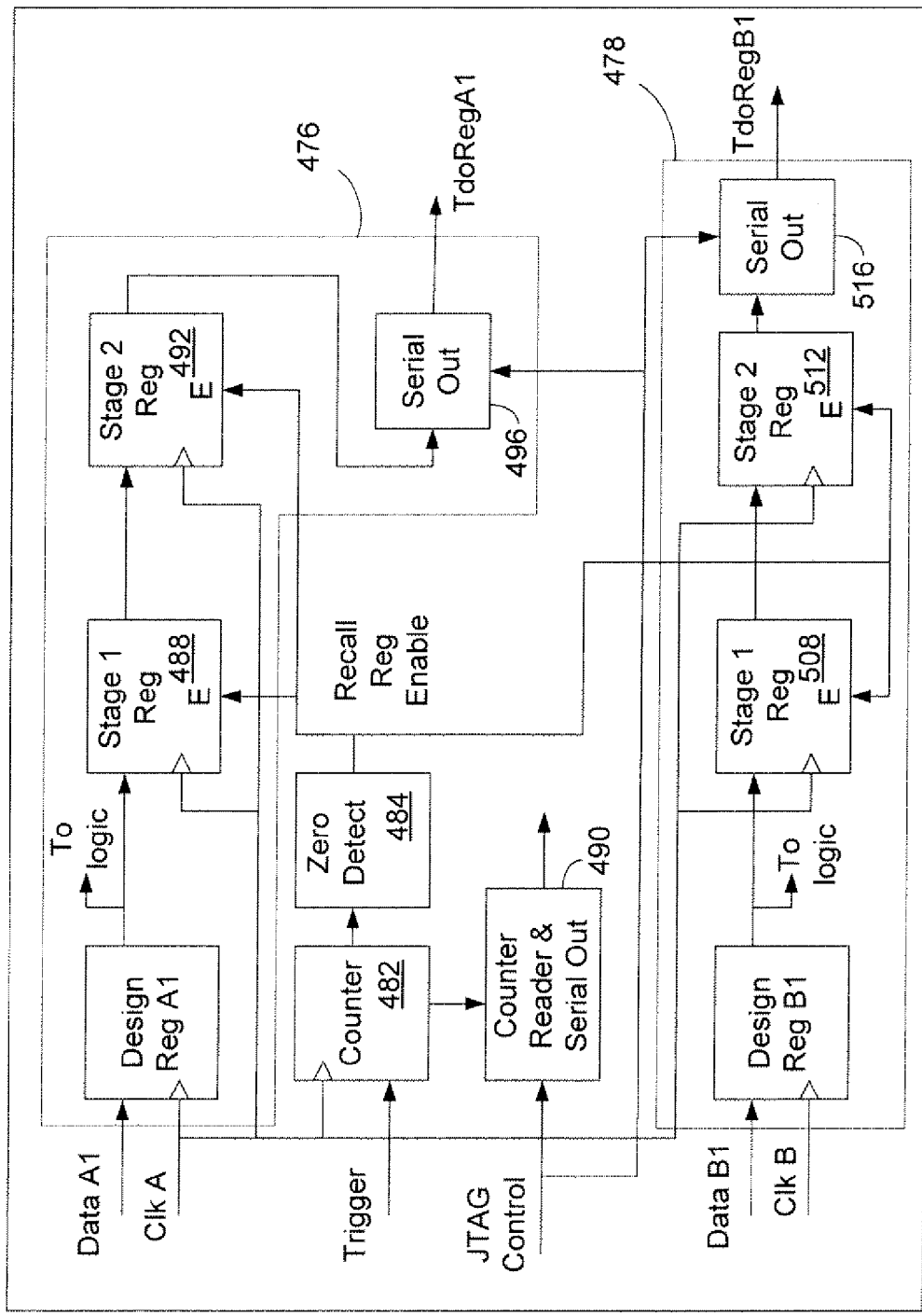
FIG. 25 is a block diagram representation of an example of a portion of the circuitry of FIG. 23 according to some embodiments of the inventions.

FIG. 25 shows two exemplary design and snapshot register units, 476 and 478, which are examples of design and snapshot register units 436-1 . . . 436-N in FIG. 23. Register unit 476 includes a design register A1, a stage 1 register 488, a stage 2 register 492, and serial out circuit 496. Register unit 478 includes a design register B1, a stage 1 register 508, a stage 2 register 512, and serial out circuit 516. The counter 482, zero detect circuit 484, and counter reader & serial out circuit 490 service both register units 376 and 478. Note that a single trigger signal works to freeze certain components of register units 476 and 488. In FIG. 23, there may be one trigger signal or more than one trigger signal. Stage 1 and stage 2 registers may be referred to as snapshot registers. Register unit 476 receives clock A and design register B1 receives clock B, yet the initial condition outputs TdoRegA1 and TdoRegB1 may be synchronized. Design registers A1 and B1 provide their register values to logic, which may be the same as or different than other illustrated logic. In some embodiments, signals are written into design registers A1 and B1 with each cycle of clocks A and B (although the same value may be repeated), and in other embodiments, signals are written into design registers A1 and B1 only when conditions are met, such as an enable signal.

In response to a clock cycle of clock A, design register A1 latches a bit from signal A1 which is provided by logic such as one of logic 422-1 . . . 422-N in FIG. 21. In response to a clock cycle of clock B, design register B1 latches a bit from signal B1 which is provided by logic such as one of logic 422-1 ... 422-N in FIG. 21. The bit of design register A1 is available to logic and to stage 1 register 488. The bit in stage 1 register 488 is available to stage 2 register 492. The bit of stage 2 register 492 is available to serial out circuit 496 which operates in response to JTAG signals. The bit of design register B1 is available to logic (which may be different than the logic that receives the bit of design register A1) and to stage 1 register 508. The bit of stage 1 register 508 is available to stage 2 register 512. The bit of stage 2 register 512 is available to serial out circuit 516 which operates in response to JTAG signals.

Although design registers A1 and B1 may receive bits from register input signals A1 and B1 with each cycle of clock A and clock B, respectively, the stage 1 and 2 registers 488, 492, 508, and 512 only latch new signals when they are enabled through a register enable signal from zero detect circuitry 484. This enabling happens as follows. A counter 482 counts with each cycle of clock A and has a count length equal to a recall length. In the example, the recall length is a count length of 1000 (in this example, 1000 clock cycles of clock A). When counter 482 counts down from the count length to zero, zero detect circuitry 484 asserts the recall register enable signal which enables stage 1 registers 488 and 508 and stage 2 register 492 and 512. Counter 482 goes back to the full-depth count minus one after reaching zero. Accordingly, every 1000 clock cycles of clock A, stage 1 and 2 registers 488 and 492 receive the register value of the previous stage. That is, stage 2 register 492 receives the register value of stage 1 register 488, and stage 1 register 488 receives the register value of design register A1. Thus, at the moment the zero detect circuit 484 provides the enable signal, stage 1 register 488 will hold the current value of the design register A1 and stage 2 register 492 will hold the register value of design register A1 from 1000 clocks cycles previous. Likewise, when the enable signal is asserted, stage 1 register 508 latches the current register value of design register B1, and stage 2 register 512 receives the register value of stage 1 register 508, which was the register value of design register B1 1000 clock A cycles previous.

When a trigger condition happens, the trigger signal freezes counter 482 so that the register values of stage 1 and 2 registers 488, 492, 508, and 512 do not change. As an example, assume the zero detect circuitry 482 enables the register enable signal so that stage 1 and 2 registers 488, 492, 508, and 512 are updated. Then, 55 clocks later a trigger signal freezes counter 482 so that the count of the counter is 1000−1−55=944. From the count of 55, the system can know that the value in the stage 1 registers 488 and 508 are from 55 clock cycles previous and the value in the stage 2 registers 492 and 512 are from 1055 clock cycles previous. Counter read & serial out 490 circuit provides the count value for use by a control circuitry (FIG. 25).

The trigger signal(s) in FIG. 25 is the same as in FIG. 24 so memories A1 and B1 are frozen at the same time as are stage 1 and 2 registers 488, 492, 508, and 512. Since the memory input FIFO is twice the depth of the specified number of clock cycles, the content of the replicated memory is the same as in the design memory from 2000 cycles prior to the time of the trigger. In some embodiments, the number of clock cycles can be specified by a designer. Since stage 2 register 492 has the register value of design register A1 from 1055 cycles previous, JTAG control signals advance the content of replicated memory A1 to the same clock cycle by advancing FIFO 450 by 945 clock cycles (2000−1055=945) to provide the contents of the FIFO 450 for these 945 clock cycles to replicated memory A1 through recall control circuit 454. Note that not all (if any) of these memory clock cycles actually perform a memory write cycle—meaning the memories do not necessarily change with each clock cycle. At the end of the 945 cycles, replicated memory A1 is a snapshot of design memory A1 from 1055 cycles previous. This matches the clock cycle time of stage 2 registers 492 and 512.

The circuit shown in FIG. 25 illustrates an exemplary embodiment, and other variations are within the scope of the present invention. For example, the snapshot registers can be clocked by clock B, or the snapshot registers can be clocked by a snapshot pulse generator without the enabling port.

Figure 26:
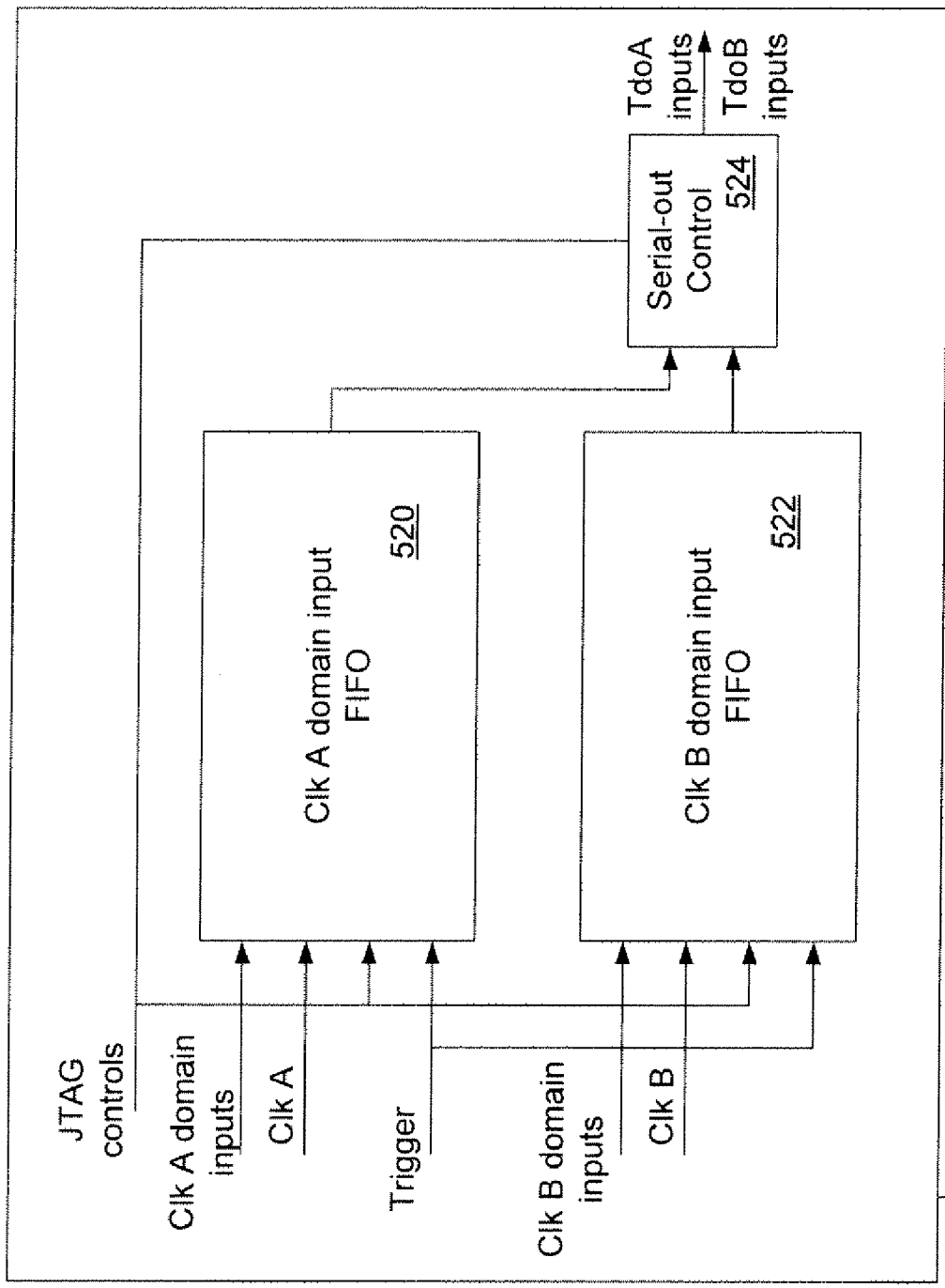
FIG. 26 is a block diagram representation of an example of a portion of the chip of FIG. 21 according to some embodiments of the inventions.

FIG. 26 illustrates a clock A domain input FIFO 520 clocked by clock A and a clock B domain input FIFO 522 clocked by clock B. FIFO 520 receives the memory data that is received by design memory A1 and FIFO 450 in FIG. 24 and design register A1 in FIG. 26. FIFO 522 receives the memory data that is received by design memory B 1 and FIFO 460 in FIG. 24 and design register B1 in FIG. 26. The depth of FIFO 520 may match the depth of FIFO 450 in FIG. 24 and the depth of FIFO 522 may match the depth of FIFO 460 in FIG. 26. In the example, the outputs of FIFO 520 and 522 do not feed design logic, but could in other embodiments.

FIFOs 520 and 522 stop receiving input signals in response to the trigger signal. JTAG control signals from JTAG control logic 420 (FIG. 21) cause certain of the input data to be written out through serial-out control 524 as TdoA inputs and TdoB inputs. Contents of FIFOs 520 and 522 for the time after the trigger condition are provided as input signals. In the example, that would be for the most recent 1055 cycles of input signals for FIFO 520 and a related number for FIFO 522. In some embodiments, this may involve a pointer or other mechanism in FIFO 520 being advanced by 945 cycles and FIFO 522 being advanced by an amount to arrive at the same position.

At this point, contents of replicated memory A1 and B1 and stage 2 registers 492 and 512 can be provided under JTAG control as initial condition signals, and contents of input FIFOs 520 and 522 can be provided under JTAG control as input signals. There may be additional replicated memories (or other forms of memory) and stage 2 registers that provide additional portions of the initial condition signals, and there may be additional FIFOs to provide additional input signals for particular simulations. As noted, other memories such as Xilinx SRLs (shift registers) in the user design may also be replicated in the same fashion as is done for the memory discussed above. In some embodiments, the contents of the SRL can be retrieved through controlling its input manipulated by the JTAG control signals. As an example, the content of the SRL also may be 2000 clocks behind the design SRL.

Even though some of the illustrated memory and register units and FIFOs in FIGS. 24-26 are clocked by clock A and others clocked by clock B, there is not a problem with synchronizing up the different components. Rather, the initial conditions and input signals are merely output for use.

There are various ways in which the snapshot solutions can be implemented. For example, a system that includes circuitry like that of FIG. 26 may include only a single stage of snapshot registers (that is, only stage 1 register 488 and not also stage 2 register 492). A system that includes circuitry like that of FIG. 26 may include more than two stages of snapshot registers (for example, stage 1 register 488, stage 2 register 492, and a stage 3 registers (not shown)). In above example, FIFO 450 twice the maximum recall look back length, but in other embodiments it could be other lengths such as more than twice the maximum recall look back length.

An exemplary embodiment of the snapshot solution can include snapshot registers for selected registers (or memory or any storage element) of the design module. In an aspect, all registers are replicated. In another aspect, only selected registers are replicated. The replicated module also includes delay circuit, for example, a FIFO, to store the input data of the design module. The depth of the delay circuit should be adequate for the period of the snapshot pulse. If there is a plurality of snapshot registers for each design register, the depth of the delay circuit is a multiple of the snapshot period. Replicated circuit for the selected memory portions of the design module can also be provided, together with control circuitry for accessing the memory content, with optional delay circuit for the input of the replicated memory. When the trigger condition occurs, the memory and the snapshot registers might not correlated with each other. In that case, the memory content is clocked a certain number of clock cycles to match with the timing of the snapshot registers.

Figure 27:
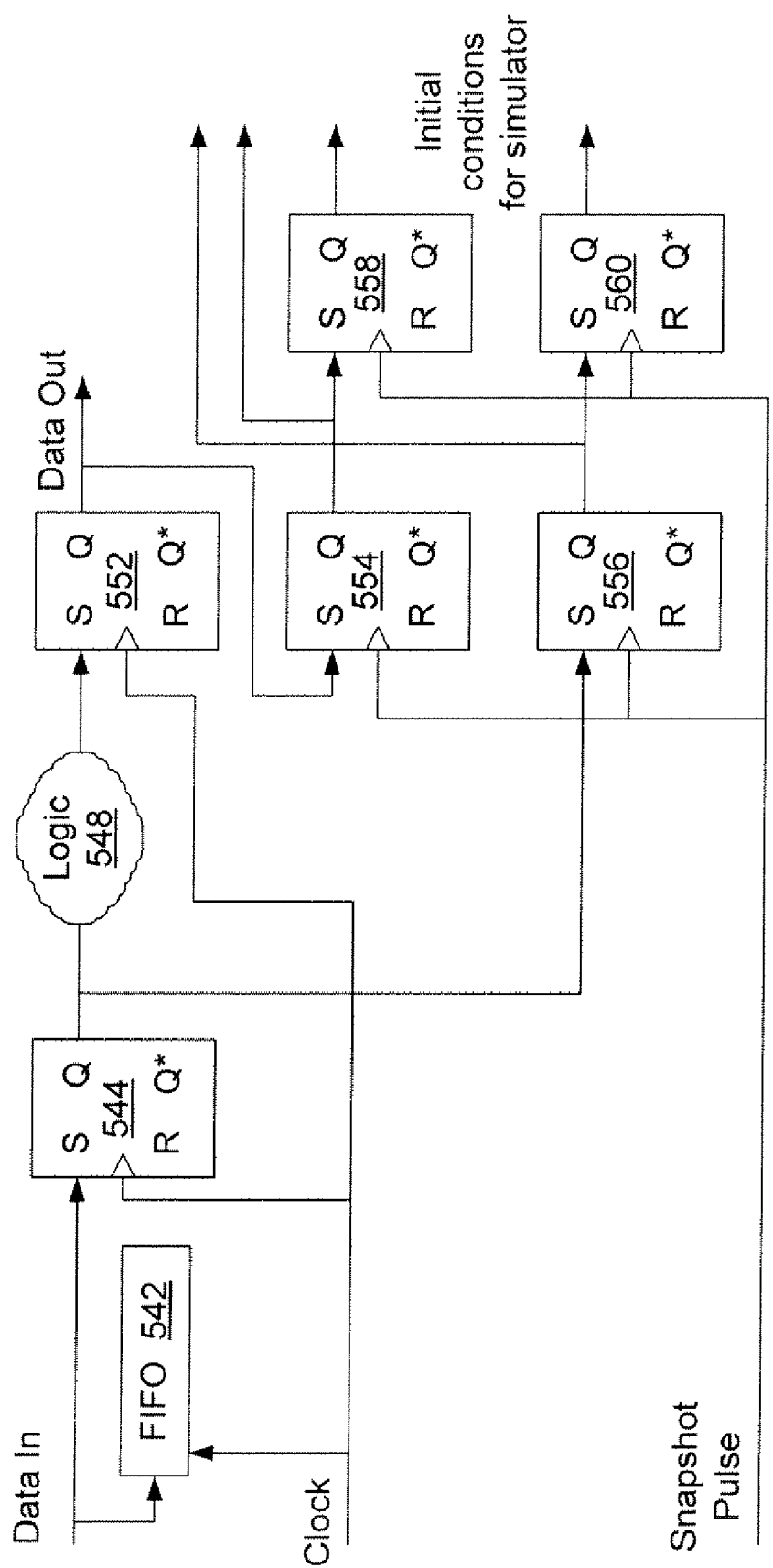
FIG. 27 is a block diagram representation of circuitry used in a snapshot solution according to some embodiments of the inventions.

FIG. 27 illustrates some alternative circuitry that may be used in some snapshot solutions. With reference to FIG. 27, consider an original design including a register or memory element such as a flip-flop followed by logic and another flip-flop similar to flip-flop 544, logic 548, and flip-flop 552. The additional components of FIG. 27 are provided to implement a snapshot solution.

Input signals are provided to a flip-flop 544 and a FIFO 542, both of which are clocked by a clock signal. Of course, there may be many signal paths, where flip-flop 544 handles only one of them. The output of flip-flop 544 is provided to logic 548, the output of which is provided to a flip-flop 552, which provides a data out signal. The outputs of flip-flops 552 and 544 are provided to flip-flops 554 and 556, which in turn provide them to flip-flops 558 and 560. A snapshot pulse clocks flip-flops 554, 558, 556, and 560. In some embodiments, the designer can choose the frequency of snapshot pulses. Once the trigger condition is detected, the snapshot pulses stop. The outputs of flip-flops 558 and 560 provide initial condition signals and FIFO 542 holds input signals for the simulators in response to a trigger signal. The initial condition signals and input signals may be scanned out to a computer or other external tester equipment and reformatted and presented to a simulator for circuit simulation.

One issue with the snapshot solution is that a trigger condition can happen at any time. In the mean time, the snapshot pulses may, but do not have to, occur at regular intervals. If the buffer depth is 256, a snapshot pulse will occur every 256 clock cycles. The trigger may happen any time between the 1st and 255th clock cycle after a snapshot pulse. If there is only a single flip-flop buffer, there may be up to 255 clock cycles, but typically would be less before a trigger condition. By adding flip-flops 558 and 560, the snapshot results are pipelined for another snapshot period (in this case 256 cycles) so that between 256 and 512 cycles samples are gathered. The depth of FIFO 542 may likewise be double. Additional circuit might be further provided to fast forward the memory content to match the timing of the snapshot registers.

The snapshot solution may be implemented in various other embodiments having some details different than shown and described above.

The snapshot solutions may be used in connection with the features mentioned in section III. The features of some sections may also be used in the same chip, but they might not be directly a part of the snapshot approach. However, an additional feature for some embodiments of the snapshot solutions may involve a method to handle various forms of RAM in design (original) logic by routing the output of the RAM into FIFOs. In some embodiments, the FIFOs may be read by the system computer and used as outputs from the RAM in software simulation.

V. Time Division Multiplexer Solutions

There are various ways in which to implement time division multiplexer (TDM) solutions. This approach creates a time multiplexed channel system, and uses the second channel to maintain the states for all of the registers and memory elements of the delayed replicated logic. Additional logic for the TDM solution can be included in the original design module, with the circuit surrounded by a multiplexer/demultiplexer pair. The data from the original path is connected to one input of the multiplexer, while the same data path, but delayed through a delay FIFO, is connected to the other input. The multiplexer combines both the original data and the delayed data into a same data path through the design logic, running by time multiplexing. Typically, a clock running at twice the speed is used to clock the design logic for both the data and the delayed data. For example, every even cycle, the original data is multiplexed into the design module pipeline while every odd cycle the delayed data is multiplexed in. The demultiplexer separates the data back into their respective data streams. When the trigger condition is detected, the circuit is frozen and the values at the delay output data stream are captured to serve as initial conditions for the debug simulation.

In an embodiment, in a time division multiplexer solution, the initial conditions and input signals related to a trigger condition can be provided as follows. An input signal is delayed, such as through a FIFO. The input signal and the delayed input signal are multiplexed and provided to logic and then demultiplexed. The delayed output signal includes initial condition signals. The initial condition signals from the delayed output signal, and input signal can be examined in a simulator to, for example, identify the cause of a trigger condition. The time division multiplexer solution may be called a cloning in time solution. The logic does not need to be replicated, which results in considerable savings in chip space and design time.

Figure 28:
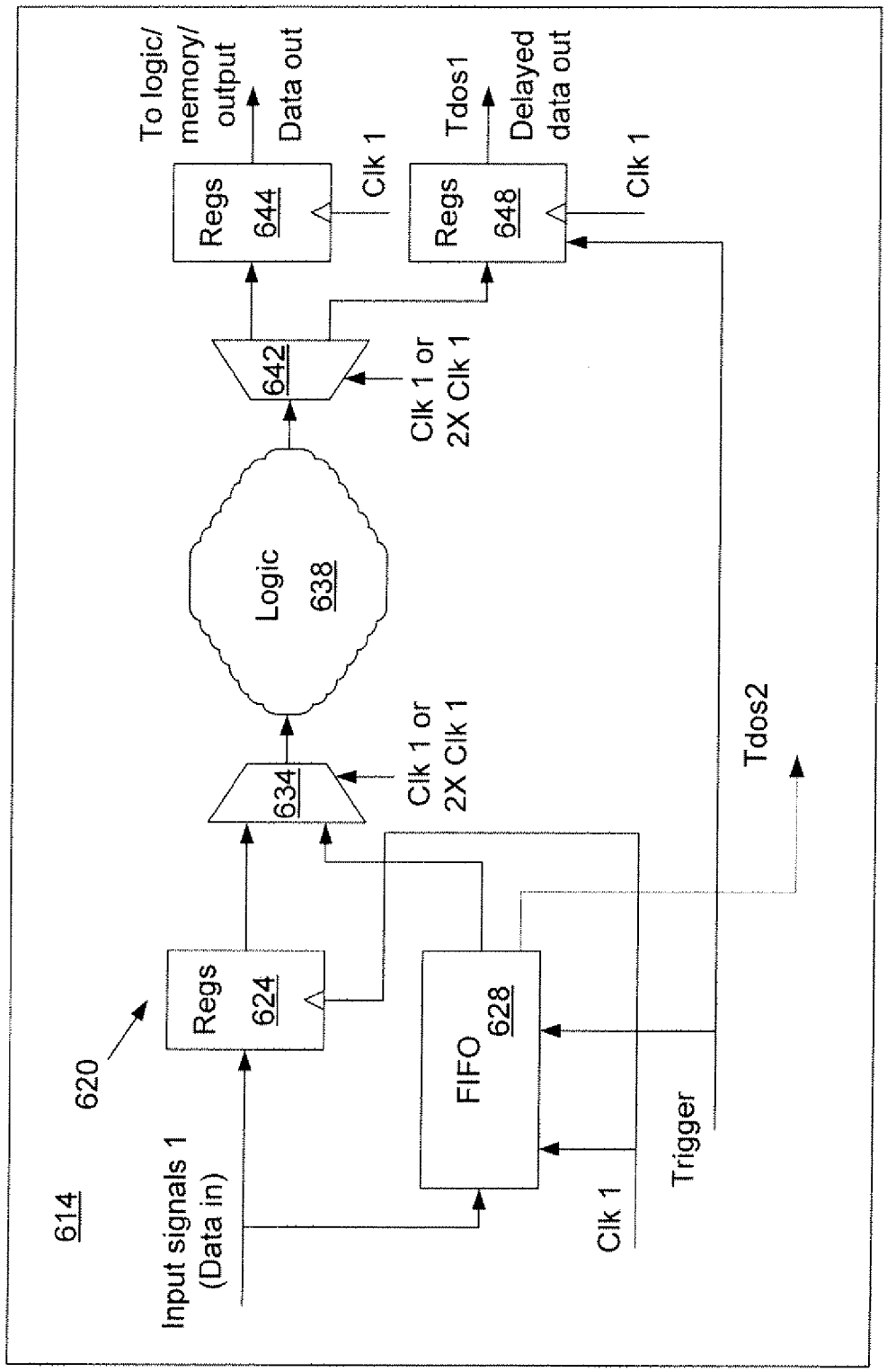
FIG. 28 is a block diagram representation of circuitry used in a time division multiplexer solution according to some embodiments of the inventions.
Figure 29:
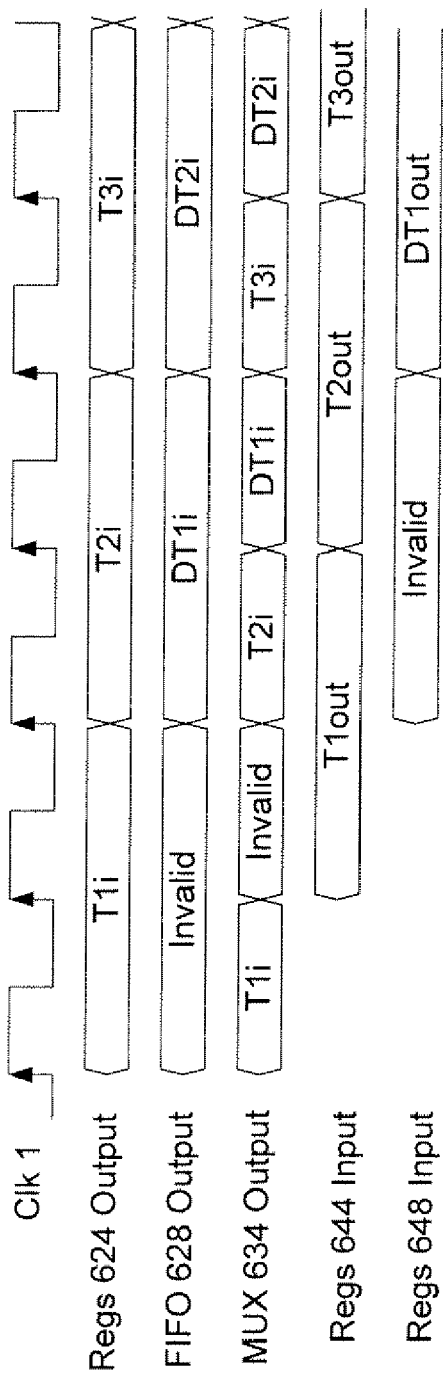
FIGS. 29 and 30 are each a timing diagram for the system of FIG. 28 according to some embodiments of the inventions.
Figure 30:
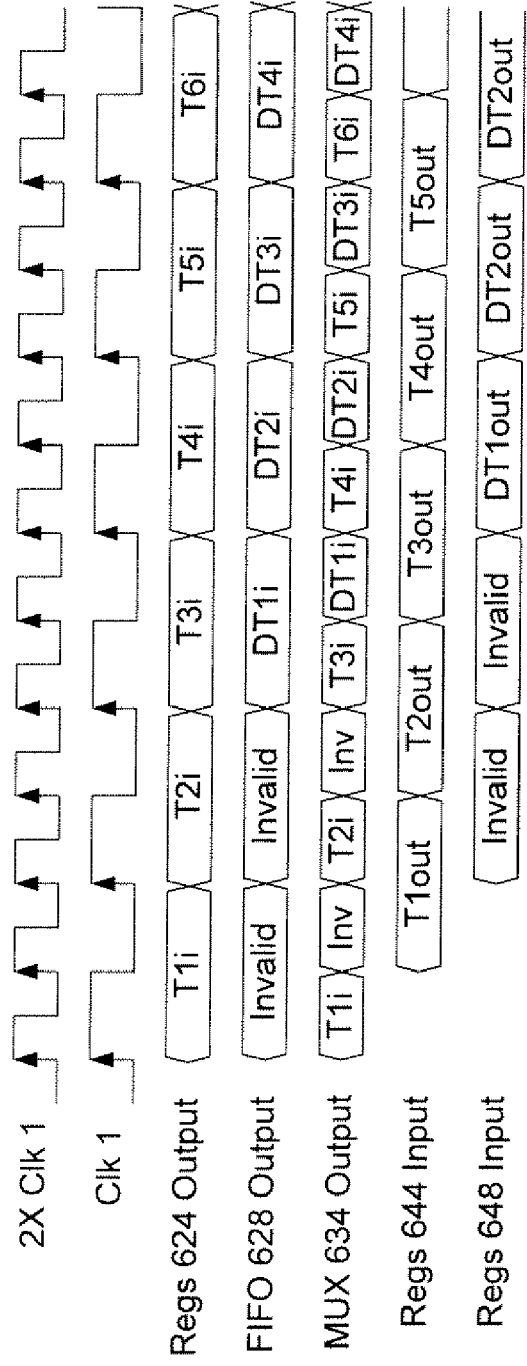

As an example, FIG. 28 illustrates a chip 614 which is an example of chip 14 in FIG. 1 or chip 38 in FIG. 2. FIG. 29 provides a timing diagram for some signals in some embodiments of FIG. 28, and FIG. 30 provides a timing diagram for some signals in other embodiments of FIG. 28.

Referring to FIGS. 28 and 29, design circuitry (or original circuitry) includes registers 624, logic 638, and registers 644. To provide initial conditions and input signals, a FIFO 628, multiplexer circuitry 634, demultiplexer circuitry 642, registers 648 and interconnections are added by at least one program (for example, FIG. 3, block 52) that revises and makes additions to the design circuitry. The program provides external access to the contents of FIFO 628 and registers 648 for use by a simulator program, for example, through JTAG.

Registers 624 and FIFO 628 receive a data input signal (data in). FIFO 628 may have a width equal to the width of the input signals and a depth to provide a desired delay to the input signal. The registers may be flip-flops. Registers 624 provide signals in cells (or time between possible transitions) T1$i$, T2$i$, T3$i$, etc. where T1$i$ means the first cell of data to be input into logic 638. FIFO 628 provides signals in cells DT1$i$, DT2$i$, DT3$i$, etc. where DT1$i$ means the first delayed cell of data to be input into logic 638. As can be seen, the length of cells T1$i$, T2$i$, T3$i$, etc. and DT1$i$, DT2$i$, DT3$i$, etc. are two clock periods. This happens if registers 624 and FIFO 624 respond to every other clock cycle of clock 1. Circuitry can be added to cause this to happen.

Since FIFO 628 delays signals, the signals out of FIFO 628 for the initial delay length are invalid data. However, this will not be a problem if the trigger condition does not happen until after the initial delay is complete. For ease of illustration, in FIG. 29, the delay through FIFO 628 is only two clock periods of clock 1. However, in practice, the delay would likely be much greater than two clock periods. For example, it could be 1000 clock periods or higher or lower number of clock periods.

A multiplexer 634 passes signals from registers 624 to logic 638 during, for example, odd numbered clock cycles and passes signals from FIFO 628 to logic 638 during even numbered clock cycles. As can be seen, the signals coming out of multiplexer 634 have a frequency of transitions between data cells that is twice that of the signals output from registers 624 and FIFO 628. Demultiplexer 642 passes signals (T1out, T2out, etc.) from logic 638 to registers 644 during, for example, odd clock cycles and passes signals (Invalid, DT1out, DT2out, etc.) from logic 638 to registers 648 during even clock cycles. Generally, registers 644 and 648 cannot be clocked at the same time, and thus one needs to be clocked off negative edge of the clock. As can be seen in FIG. 29, the signals coming out of demultiplexer 642 have a cell length that is twice that of signals in coming into demultiplexer 642. The output of registers 644 can be provided for various purposes depending on the implementation. In response to a trigger signal, FIFO 628 and registers 648 freeze. The contents of registers 648 can be used as initial condition signals Tdos1 and the contents of FIFO 628 can be used as input signals Tdos2 for a simulator through, for example, a JTAG interface. Depending on the implementation, it may take only one clock period for data to pass from multiplexer 634 through logic 638 to a demultiplexer 642. In other embodiments, it may take more than one clock period. In some embodiments, there may be a one or two cycle delay before the trigger signal is applied to registers 648. That delay can be considered in deciding which signals are the initial condition signals.

The details of FIGS. 28 and 29 are not required for all embodiments. For example, in some embodiments, logic 638, which typically does contain any registers or state information, is able to handle data rates equivalent to a 2× clock. In some embodiments, multiplexer 634 and/or demultiplexer 642 also are clocked by the 2× clock. Depending on the implementation, other components may also receive the higher frequency clock. Double or quad data rate signaling may be used.

Figure 31:
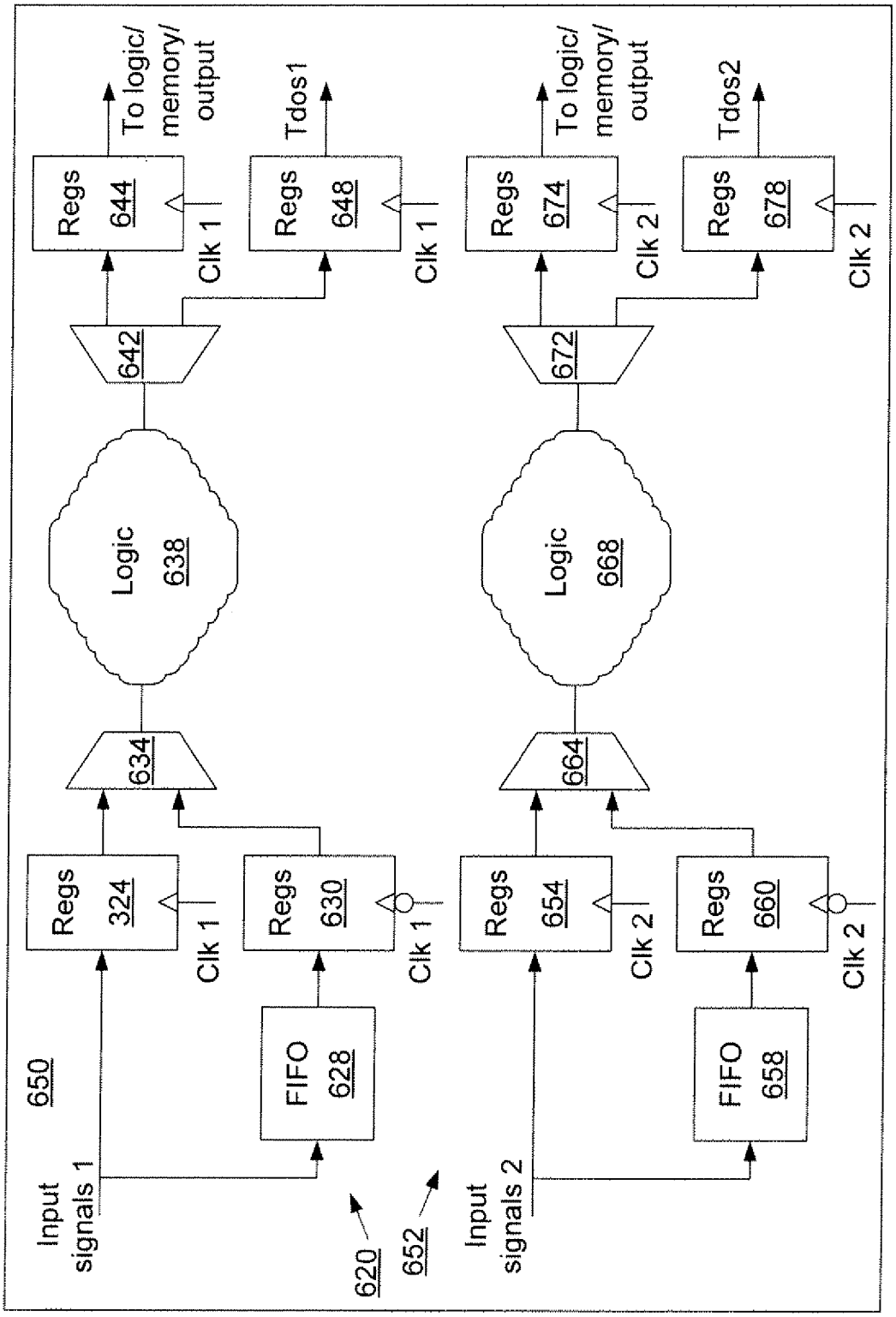
FIG. 31 is a block diagram representation of circuitry used in a time division multiplexer solution according to some embodiments of the inventions.

FIG. 30 provides a timing diagram for one of the various implementations of FIG. 28 in which a 2× clock 1 signal is used for clocking. In FIG. 30, the T1$i$, T2$i$ etc. and invalid, DT1$i$, DT2$i$, etc. signal cells have a length equal to the clock 1 period. Multiplexer 634 provides signals T1$i$, invalid, T2$i$, invalid, T3$i$, DT1$i$, T4$i$, DT2$i$, etc. wherein the cells have a length equal to the one period of 2× clock 1. The T1 out, T2out, etc. and invalid, invalid, DT1out, DT2out signals have cells with a length equal to the period of clock 1. In some embodiments, the signals of FIGS. 29 and 30 do not technically include cells, but the figures still schematically illustrate time between possible transitions FIG. 31 illustrates both time division multiplexer circuitry 650 clocked by clock 1 and second time division multiplexer circuitry 652 clocked by a clock 2. Clocks 1 and 2 may be asynchronous and have different frequencies. Alternatively, clocks 1 and 2 may be identical or have different frequencies where one is an integer multiple of the other. Circuitry 650 is the same as circuitry 620 in FIG. 28 but registers 630 are added which respond to the falling edge. Registers 630 are optional and just illustrate yet another alternative. Circuitry 652 includes registers 654, FIFO 658 that receive input signals 2 (data in), and (in some embodiments) registers 660.

Multiplexer 664 multiplex signals from registers 654 and from registers 660 and provides them to logic 668. Demultiplexer 672 receives output signals from logic 668 and demultiplexes them to provide signals to registers 674 and 678. When a trigger signal is asserted in response to a trigger condition, FIFO 658 and registers 678 are frozen and provide input data and initial conditions for a simulator program. As noted in connection with FIG. 28, different components of time division multiplexer circuitry 620 may be clocked by clocks with different frequencies. Likewise, time division multiplexer circuitry 650 and 652 may be clocked by clocks with different frequencies.

Figure 32:
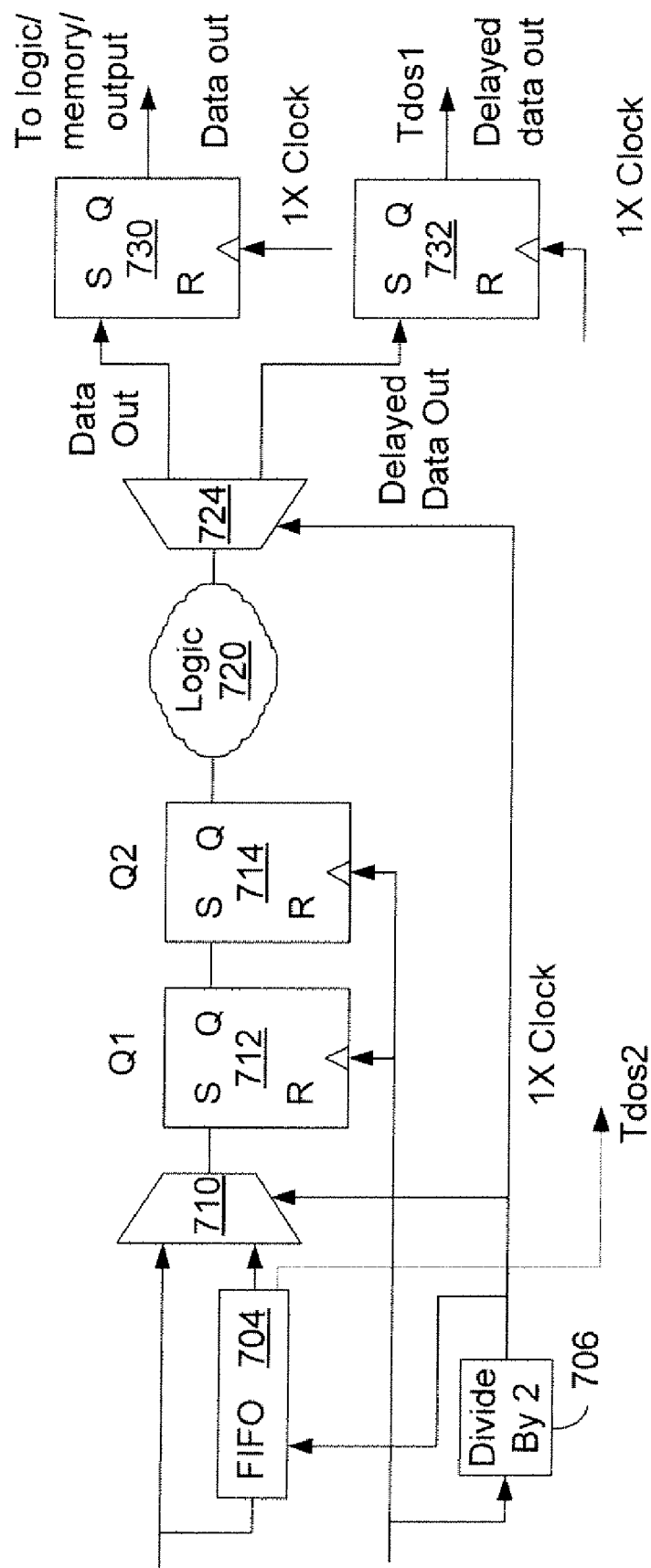
FIG. 32 is a block diagram representation of circuitry used in a time division multiplexer solution according to some embodiments of the inventions.

FIG. 32 illustrates another embodiment of time division multiplexer circuitry. A flip-flop register 714, logic 720, and register 730 are part of design circuitry. The additional circuitry of FIG. 32 is provided to gather initial condition and input signals associated with a trigger condition. In some embodiments, the additional circuitry of FIG. 32 (and the other figures) is automatically designed by a program(s). In different implementations, there is different circuit designer involvement in this process.

Figure 33:
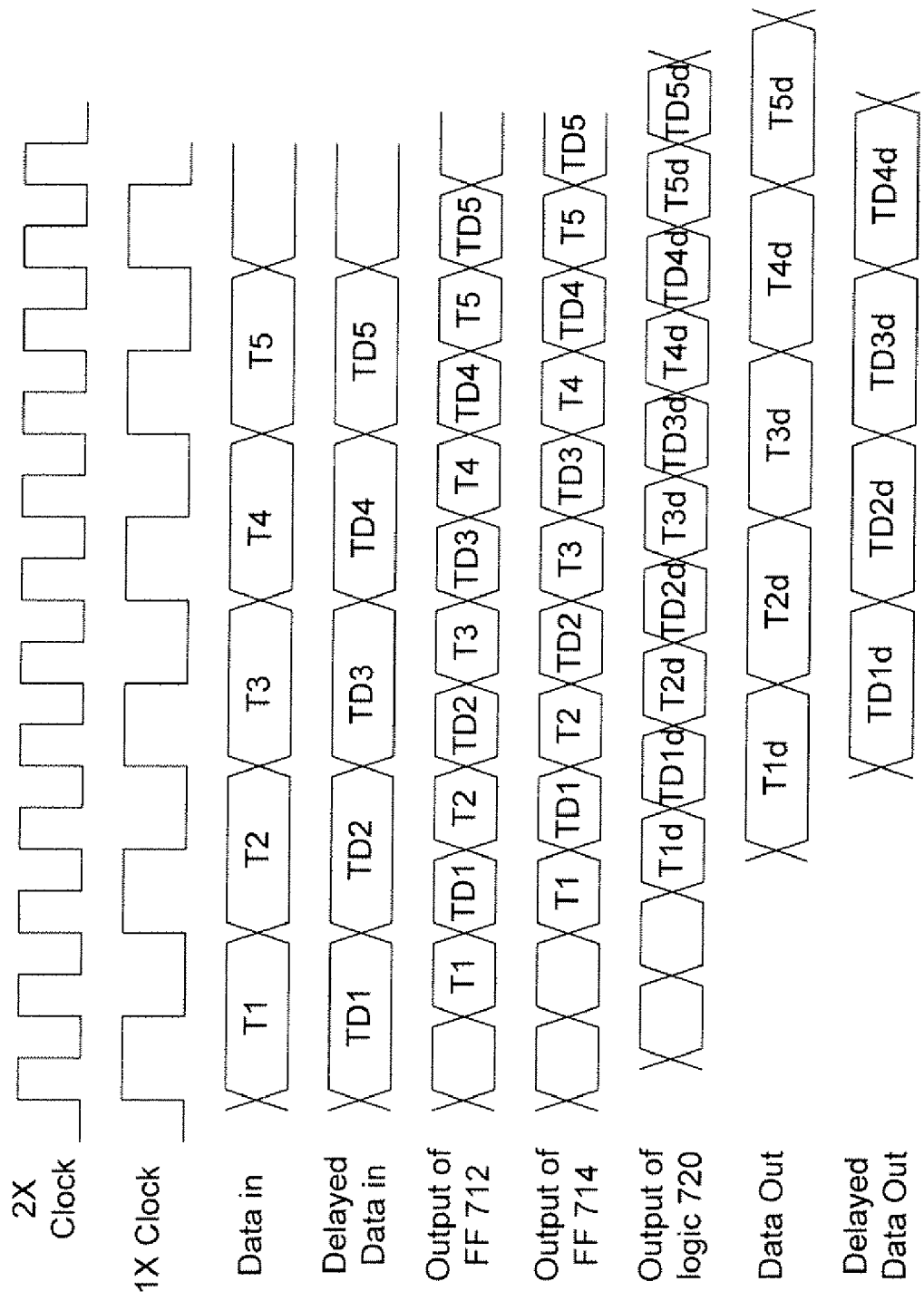
FIG. 33 is a timing diagram for the system of FIG. 32.

FIG. 33 is a timing diagram for the circuitry of FIG. 32. Referring to FIGS. 32 and 33, input signals (data in) T1, T2, T3, T4, etc. are received by a multiplexer 710 and by a FIFO 704 which provides delayed data in signals TD1, TD2, TD3, TD4 etc. to multiplexer 710. FIFO 704 has a width to receive multiple parallel data in signals. Flip-flops registers 712 and 714 are clocked by a 2× clock signal. A 1× clock signal is derived by divide by 2 circuit 706. (Alternatively, the 2× clock could be generated by multiplying the 1× clock by 2.) The 1× clock signal clocks FIFO 704, multiplexer 710, and demultiplexer 724. In a preferred embodiment, logic Logic 720 may be clocked by the 2× clock, but in other embodiments it is clocked by the 1× clock. Registers 730 and 732 may be clocked by the 1× clock (or in other implementations the 2× clock). As an example, in every odd cycle, the data is multiplexed in, while every even cycle, the delayed data is multiplexed in. The output of multiplexer 710 (T1, TD1, T2, TD2, T3, TD3) is provided to registers 712 (Q1) to delay the output by one period of the 2× clock and provide it to register 714 which likewise delays it by another period of the 2× clock. At any one time, the pipelined registers 712 and 714 contain data from both data in and delayed data in inputs to multiplexer 710.

Logic 720 may provide an output (T1$d$, TD1$d$, T2$d$, TD2$d$, etc.) of the same frequency, but further delayed. Demultiplexer 724 may provide the data out signal (T1$d$, T2$d$, T3$d$, etc.), and the delay data out signal (TD1$d$, TD2$d$, TD3$d$, etc.) at half the frequency, which are provided to registers 730 and registers 732, respectively. The circuitry of FIG. 32 is allowed to run until a trigger condition is detected. At that time, FIFO 704 and registers 732 are frozen and provide the input signals and initial conditions for the simulation/debug. The time division multiplexer circuitry of FIG. 32 may be modified in various ways.

With time division multiplexing, the same design logic (for example, logic 638 or logic 720) may be used for determining the next state for both the real time registers and the delayed registers. Twice as much data is processed through the common elements within a design using the TDM approach versus the original design. If propagation delays through the common elements are significant, the clock speeds may be reduced to make sure the circuit functions properly. The TDM solutions may be used in connection with the features mentioned in section III.

VI. Additional Information and Embodiments

The inventions are not restricted to any particular type of signaling. The input and clock signals can be single ended or differential. The clocks may include "eyes." The clocking can be single data rate, double data rate, quad data rate, etc. In double data rate, a rising or falling edge of a single clock signal may be used, or two out of phase clocks may be used. The signals may be packetized or non-packetized. The clock signal(s) may originate internally or externally to the chip. It may always be separate from the data signals or be embedded in the data signals and recovered there from.

The programs described herein (such as in FIG. 3 and those used in connection with FIGS. 4 and 5) for designing, configuring, fabricating, operating, debugging, gathering initial condition signals and input signals for simulating may be provided over the Internet (such as through downloaded signals) or through a storage medium such as a CD ROM, DVD, flash memory, or other memory. Once received, the programs can be stored in computer memory or other memory. In some embodiments, instructions to perform the functions in the chips are hardwired into the circuits. In other embodiments, at least some of the functions may be initiated through firmware and/or software. Such firmware or software can be provided over the Internet or through a storage medium such as a CD ROM, DVD, flash memory, or other memory. In some cases, logic includes only circuitry and in other cases, logic includes circuitry that operates in response to software or firmware.

The figures are schematic in nature and not intended to necessarily represent actual circuit layouts. Further, in actual implementations, there will be various additional circuitries in the chips and there may be circuitry between circuitry illustrated in the figures. The illustrated components may have various additional inputs and outputs. Various embodiments of the inventions may include details different than those illustrated and described herein.

Although registers are a type of memory, they hold one bit at a time and the memories referred to in this disclosure hold more than one bit at a time. In some figures, a single register (or flip-flop) is illustrated as receiving an input signal. However, these registers could represent multiple parallel registers receiving parallel data bits. For example, in FIG. 25, design register A1, stage 1 register 488, and stage 2 register 492 can each represent multiple parallel registers that receive parallel signals.

In some embodiments, the bit in a register could be a multi-level bit that holds more than one bit worth of information. That is, in some cases, signals have merely a high or a low voltage, and in other cases, signals have multiple levels to represent more than two values per bit. The above described solutions can be modified to incorporate multi-level signaling.

In some implementations, the FIFOs have a fixed depth and in others the FIFOs have a depth than can change after the fabrication or configuration. Counters may count down to zero or another value, or they may count up from zero or another value. Many of the methods of the present inventions may be performed with a digital processing system, such as a conventional, general purpose computer system. Special purpose computers which are designed or programmed to perform only limited functions may also be used.

If the specification states a component, feature, structure, or characteristic "may", "might", or "could" be included, that particular component, feature, structure, or characteristic is not required to be included. If the specification or claim refers to "a" structure, that does not mean there is only one of the structure.

One embodiment of the present invention may be a circuit design and synthesis computer aided design software that is implemented as a computer program which is stored in a machine readable media, such as a CD ROM or a magnetic hard disk or an optical disk or various other alternative storage devices. Further, many of the methods of the present invention may be performed with a digital processing system, such as a conventional, general purpose computer system. Special purpose computers which are designed or programmed to perform only one function may also be used.

Figure 34:
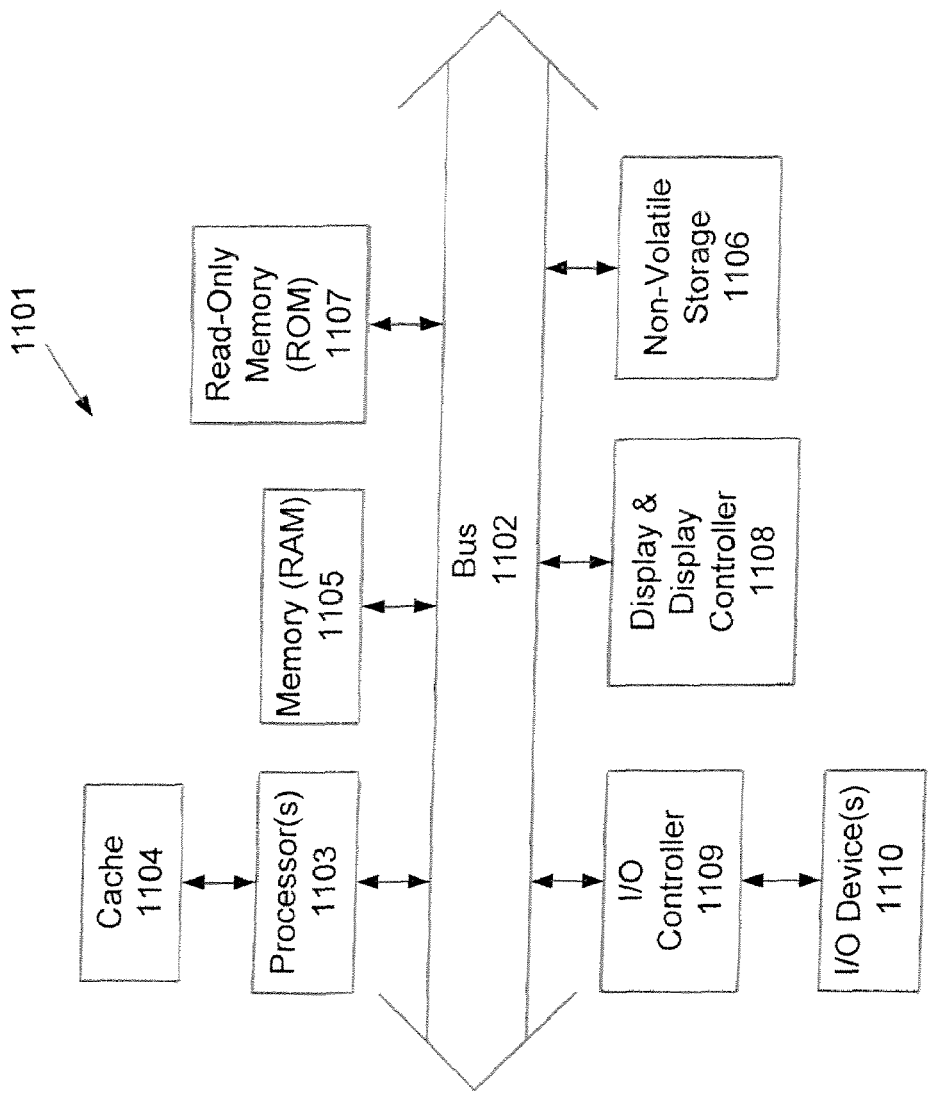
FIG. 34 shows an exemplary computer system which may be used with the present invention.

FIG. 34 shows one example of a typical computer system which may be used with the present invention. The computer system can be used to perform logic synthesis of a design that is described in an HDL code. Note that while FIG. 34 illustrates various components of a computer system, it is not intended to represent any particular architecture or manner of interconnecting the components as such details are not germane to the present invention. It should be noted that the architecture of FIG. 34 is provided for purposes of illustration only and that a computer system or other digital processing system used in conjunction with the present invention is not limited to this specific architecture. It will also be appreciated that network computers and other data processing systems which have fewer components or perhaps more components may also be used with the present invention. The computer system of FIG. 34 may, for example, be an IBM or an Apple Macintosh computer.

As shown in FIG. 34, the computer system 101, which is a form of a data processing system, includes a bus 1102 which is coupled to a microprocessor 1103 and a ROM 1107 and volatile RAM 1105 and a non-volatile memory 1106. The microprocessor 1103, which may be a microprocessor from Intel or Motorola, Inc. or IBM, is coupled to cache memory 1104. The bus 1102 interconnects these various components together and also interconnects these components 1103, 1107, 1105, and 1106 to a display controller and display device 1108 and to peripheral devices such as input/output (I/O) devices which may be mice, keyboards, modems, network interfaces, printers, scanners, video cameras and other devices which are well known in the art. Typically, the input/output devices 1110 are coupled to the system through input/output controllers 1109. The volatile RAM 1105 is typically implemented as dynamic RAM (DRAM) which requires power continually in order to refresh or maintain the data in the memory. The non-volatile memory 1106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 34 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 1102 may include one or more buses connected to each other through various bridges, controllers and/or adapters as is well known in the art. In one embodiment the I/O controller 1109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 1107, volatile RAM 1105, non-volatile memory 1106, cache 1104 or a remote storage device. In various embodiments, hardwired circuitry may be used in combination with software instructions to implement the present invention. Thus, the techniques are not limited to any specific combination of hardware circuitry and software, nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 1103.

A machine readable medium can be used to store software and data which when executed by a data processing system causes the system to perform various methods of the present invention. This executable software and data may be stored in various places including for example ROM 1107, volatile RAM 1105, non-volatile memory 1106 and/or cache 1104. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

While the invention has been described in terms of several embodiments, the invention should not be limited to only those embodiments described, but can be practiced with modification and alteration within the spirit and scope of the appended claims. The description is thus to be regarded as illustrative instead of limiting.

What is claimed is:

1. A method comprising circuitry to perform:
   receiving, using a computer, a first and a second asynchronous clock signal having a first phase relationship at a first transition of the first asynchronous clock signal;
   sampling the second clock signal at the transition of the first clock signal;
   storing the samples; and
   analyzing the samples to ascertain the first phase relationship of the second clock signal with respect to the first clock signal and provide a representation of the first phase relationship.

2. The method of claim 1, further comprising using the first phase relationship in a simulation of a circuitry.

3. The method of claim 1, further comprising:
   receiving a third clock signal that is asynchronous to the first and second clock signals and that has a second phase relationship with the first clock signal at a second transition of the first asynchronous clock signal;
   sampling the third clock signal at the second transition of the first clock;
   storing the samples of the third clock signal;
   analyzing the samples to ascertain the second phase relationship of the first and third clocks and provide a representation of the second phase relationship.

4. The method of claim 1, wherein the first and second clock signals are received by a circuitry including a design logic and a replicated logic to provide initial condition signals.

5. The method of claim 1, wherein the first and second clock signals are received by a circuitry including a design memory and design registers and a replicated memory and replicated registers to provide initial condition signals.

6. The method of claim 1, wherein the first and second clock signals are received by a circuitry including a logic, a multiplexer to multiplex an input signal and a delayed input signal to the logic, and a demultiplexer to provide an output signal and a delayed output signal from the logic to provide initial condition signals.

7. An apparatus comprising a non-transitory machine readable medium that contains instructions which when executed cause a computer to generate a description of circuitry that:
   receives a first and a second asynchronous clock signal having a first phase relationship at a first transition of the first asynchronous clock signal;
   samples the second clock signal at the transition of the first clock signal;
   stores the samples; and
   analyzes the samples to ascertain the first phase relationship of the second clock signal with respect to the first clock signal and provide a representation of the first phase relationship.

8. The apparatus of claim 7, wherein the instructions when executed further cause a computer to use the first phase relationship in a simulation of the circuitry.

9. The apparatus of claim 7, wherein the described circuitry includes a design logic and a replicated logic to provide initial condition signals.

10. The apparatus of claim 7, wherein the described circuitry includes a design memory and design registers and a replicated memory and replicated registers to provide initial condition signals.

11. The apparatus of claim 7, wherein the described circuitry includes a logic, a multiplexer to multiplex an input signal and a delayed input signal to the logic, and a demultiplexer to provide an output signal and a delayed output signal from the logic to provide initial condition signals.

12. A method comprising generating a hardware description of a circuitry that:
   receives a first and a second asynchronous clock signal having a first phase relationship at a first transition of the first asynchronous clock signal;
   samples the second clock signal at the transition of the first clock signal;
   stores the samples; and
   analyzes the samples, using a computer, to ascertain the first phase relationship of the second clock signal with respect to the first clock signal and provide a representation of the first phase relationship.

13. The method of claim 12, further comprising using the first phase relationship in a simulation of the circuitry.

14. The method of claim 12, wherein the described circuitry includes a design logic and a replicated logic to provide initial condition signals.

15. An apparatus comprising:
   a receiving circuitry to receive a first and a second asynchronous clock signals having a first phase relationship at a first transition of the first asynchronous clock signal;
   a sampling circuitry to sample the second clock signal at the transition of the first clock signal;
   a storing circuitry to store the samples; and
   an analyzing logic to analyze the samples to ascertain the first phase relationship of the second clock signal with respect to the first clock signal and provide a representation of the first phase relationship.

16. The apparatus of claim 15, wherein the receiving circuitry and analyzing logic are part of a single integrated circuit chip.

17. The apparatus of claim 15, further comprising a chip interface and a circuitry to provide the first phase relationship to the chip interface.

18. The apparatus of claim 15, further comprising a design logic and a replicated design logic to receive the first and second clock signals, wherein the replicated design logic includes the receiving circuit and provides initial condition signals.

19. The apparatus of claim 15, further comprising a design memory and design registers and a replicated memory and replicated registers to receive the first and second clock signals, wherein the replicated memory and replicated registers include the receiving circuitry and provide initial condition signals.

20. The apparatus of claim 15, further comprising an additional logic to receive the first and second clock signals, and further comprising a circuitry including a multiplexer to multiplex an input signal and a delayed input signal to the logic, and a demultiplexer to provide an output signal and a delayed output signal from the additional logic to provide initial condition signals.

* * * * *